United States Patent
Yu et al.

(10) Patent No.: US 9,508,703 B2
(45) Date of Patent: Nov. 29, 2016

(54) STACKED DIES WITH WIRE BONDS AND METHOD

(71) Applicant: Taiwan Semiconductor Manufacturing Company, Ltd., Hsin-Chu (TW)

(72) Inventors: Chen-Hua Yu, Hsin-Chu (TW); Ming-Fa Chen, Taichung (TW); Sung-Feng Yeh, Taipei (TW); Meng-Tse Chen, Changzhi Township (TW); Hui-Min Huang, Taoyuan (TW); Hsiu-Jen Lin, Zhubei (TW); Ming-Da Cheng, Jhubei (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/543,760

(22) Filed: Nov. 17, 2014

(65) Prior Publication Data
US 2015/0318264 A1 Nov. 5, 2015

Related U.S. Application Data

(60) Provisional application No. 61/986,617, filed on Apr. 30, 2014.

(51) Int. Cl.
*H01L 25/00* (2006.01)
*H01L 25/065* (2006.01)
(Continued)

(52) U.S. Cl.
CPC ............ *H01L 25/50* (2013.01); *H01L 23/3114* (2013.01); *H01L 23/3157* (2013.01); *H01L 23/481* (2013.01); *H01L 23/538* (2013.01); *H01L 24/09* (2013.01); *H01L 24/73* (2013.01); *H01L 24/92* (2013.01); *H01L 24/94* (2013.01); *H01L 24/97* (2013.01); *H01L 25/0657* (2013.01); *H01L 23/3121* (2013.01); *H01L 2224/02372* (2013.01); *H01L 2224/0345* (2013.01); *H01L 2224/03452* (2013.01); *H01L 2224/0401* (2013.01); *H01L 2224/04042* (2013.01); *H01L 2224/04105* (2013.01); *H01L 2224/0557* (2013.01); *H01L 2224/05567* (2013.01); *H01L 2224/05572* (2013.01); *H01L 2224/05573* (2013.01); *H01L 2224/05583* (2013.01); *H01L 2224/05624* (2013.01); *H01L 2224/05644* (2013.01); *H01L 2224/05647* (2013.01); *H01L 2224/05655* (2013.01);
(Continued)

(58) Field of Classification Search
CPC ..................................................... H01L 24/46
See application file for complete search history.

(56) References Cited

U.S. PATENT DOCUMENTS

| 5,969,426 A | 10/1999 | Baba et al. |
| 6,383,838 B2 | 5/2002 | Ryu |

(Continued)

FOREIGN PATENT DOCUMENTS

| KR | 20010058579 A | 7/2001 |
| KR | 20130082314 A | 7/2013 |

*Primary Examiner* — William Harriston
(74) *Attorney, Agent, or Firm* — Slater Matsil, LLP

(57) ABSTRACT

Semiconductor dies are bonded to each other and electrically connected to each other. An encapsulant is utilized to protect the semiconductor dies and external connections are formed to connect the semiconductor dies within the encapsulant. In an embodiment the external connections may comprise conductive pillars, conductive reflowable material, or combinations of such.

20 Claims, 26 Drawing Sheets

(51) Int. Cl.
*H01L 23/00* (2006.01)
*H01L 23/31* (2006.01)
*H01L 23/48* (2006.01)
*H01L 23/538* (2006.01)

(52) U.S. Cl.
CPC ........... *H01L2224/05666* (2013.01); *H01L 2224/05671* (2013.01); *H01L 2224/05684* (2013.01); *H01L 2224/06181* (2013.01); *H01L 2224/08111* (2013.01); *H01L 2224/08146* (2013.01); *H01L 2224/08235* (2013.01); *H01L 2224/1132* (2013.01); *H01L 2224/1145* (2013.01); *H01L 2224/11334* (2013.01); *H01L 2224/11462* (2013.01); *H01L 2224/11849* (2013.01); *H01L 2224/13022* (2013.01); *H01L 2224/13111* (2013.01); *H01L 2224/13139* (2013.01); *H01L 2224/13147* (2013.01); *H01L 2224/1403* (2013.01); *H01L 2224/14051* (2013.01); *H01L 2224/14181* (2013.01); *H01L 2224/16145* (2013.01); *H01L 2224/16227* (2013.01); *H01L 2224/1703* (2013.01); *H01L 2224/17051* (2013.01); *H01L 2224/17181* (2013.01); *H01L 2224/273* (2013.01); *H01L 2224/2919* (2013.01); *H01L 2224/32145* (2013.01); *H01L 2224/45144* (2013.01); *H01L 2224/48091* (2013.01); *H01L 2224/48145* (2013.01); *H01L 2224/49109* (2013.01); *H01L 2224/73207* (2013.01); *H01L 2224/73253* (2013.01); *H01L 2224/73257* (2013.01); *H01L 2224/73265* (2013.01); *H01L 2224/81815* (2013.01); *H01L 2224/81895* (2013.01); *H01L 2224/83191* (2013.01); *H01L 2224/83192* (2013.01); *H01L 2224/9222* (2013.01); *H01L 2224/92163* (2013.01); *H01L 2224/92225* (2013.01); *H01L 2224/92247* (2013.01); *H01L 2224/94* (2013.01); *H01L 2224/97* (2013.01); *H01L 2225/0651* (2013.01); *H01L 2225/06506* (2013.01); *H01L 2225/06513* (2013.01); *H01L 2225/06517* (2013.01); *H01L 2225/06524* (2013.01); *H01L 2225/06541* (2013.01); *H01L 2225/06568* (2013.01); *H01L 2924/10252* (2013.01); *H01L 2924/10253* (2013.01); *H01L 2924/10271* (2013.01); *H01L 2924/141* (2013.01); *H01L 2924/1431* (2013.01); *H01L 2924/1434* (2013.01); *H01L 2924/1461* (2013.01); *H01L 2924/15311* (2013.01); *H01L 2924/181* (2013.01)

(56) References Cited

U.S. PATENT DOCUMENTS

| | | | |
|---|---|---|---|
| 7,160,755 | B2 | 1/2007 | Lo et al. |
| 8,030,770 | B1 | 10/2011 | Juskey et al. |
| 8,436,481 | B2 | 5/2013 | Hoshino et al. |
| 2007/0069391 | A1 | 3/2007 | Gritti |
| 2007/0152313 | A1 | 7/2007 | Periaman et al. |
| 2008/0224322 | A1 | 9/2008 | Shinogi |
| 2008/0246126 | A1 | 10/2008 | Bowles et al. |
| 2013/0175706 | A1 | 7/2013 | Choi et al. |
| 2013/0240141 | A1 | 9/2013 | Soejima et al. |
| 2014/0197526 | A1* | 7/2014 | Yoo .................... H01L 24/97 257/676 |

* cited by examiner

STACKED DIES WITH WIRE BONDS AND METHOD

This application claims the benefit of provisionally filed U.S. Patent Application Ser. No. 61/986,617, filed Apr. 30, 2014, and entitled "Wafer Level Package with Through Vias," which application is hereby incorporated herein by reference.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are utilized.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
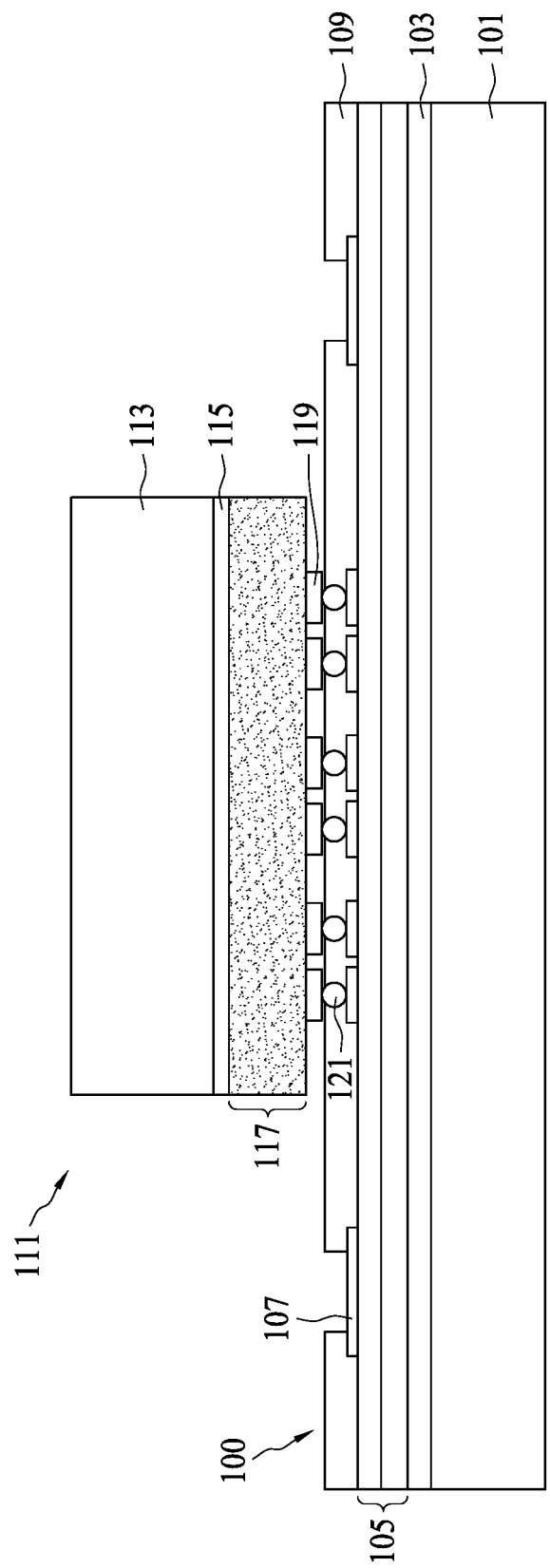
FIG. 1 illustrates a first die connected to a first wafer, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is illustrated an embodiment with a first wafer 100 bonded to a first die 111 in a chip on wafer (CoW) configuration and a flip-chip, face-to-face configuration, wherein the first active device layer 103 and the second active device layer 115 are facing each other. In an embodiment the first wafer 100 comprises multiple third dies 607 (not separately illustrated in FIG. 1 but illustrated and described below with respect to FIG. 6), which may individually be semiconductor dies that comprise logic devices, eFlash device, memory device, microelectromechanical (MEMS) devices, analog devices, combinations of these, or the like.

In an embodiment the first wafer 100 comprises a first substrate 101, a first active device layer 103, first metallization layers 105, first contact pads 107, and a first protective layer 109. In an embodiment the first substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active device layer 103 may comprise a wide variety of active devices such as transistors and the like and passive devices such as capacitors, resistors, inductors and the like that may be used to generate the desired structural and functional parts of the design for the first wafer 100. The active devices and passive devices within the first active device layer 103 may be formed using any suitable methods either within or else on the first substrate 101.

The first metallization layers 105 are formed over the first substrate 101 and the first active device layer 103 and are designed to connect the various first active devices to form functional circuitry for the first wafer 100. In an embodiment the first metallization layers 105 are formed of alternating layers of dielectric and conductive material and may be formed through any suitable process (such as deposition, damascene, dual damascene, etc.). In an embodiment there may be four layers of metallization separated from the first substrate 101 by at least one interlayer dielectric layer (ILD), but the precise number of metallization layers is dependent upon the design of the first wafer 100.

The first contact pads 107 are formed in order to provide external contacts for the first metallization layers 105 and the first active device layer 103. In an embodiment the first contact pads 107 are formed of a conductive material such as aluminum, although other suitable materials, such as copper, tungsten, or the like, may alternatively be utilized. The first contact pads 107 may be formed using a process such as CVD or PVD, although other suitable materials and methods may alternatively be utilized. Once the material for the first contact pads 107 has been deposited, the material may be shaped into the first contact pads 107 using, e.g., a photolithographic masking and etching process.

Once the first contact pads 107 have been formed, the first protective layer 109 may be placed and patterned. In an embodiment the first protective layer 109 may be a protective material such as polybenzoxazole (PBO) or polyimide (PI), silicon oxide, silicon nitride, silicon oxynitride, benzocyclobutene (BCB), or any other suitable protective material. The first protective layer 109 may be formed using a method such as a spin-on process, a deposition process (e.g., chemical vapor deposition), or other suitable process based upon the chosen material, and may be formed to a thickness of between about 1 μm and about 100 μm, such as about 20 μm.

Once formed the first protective layer 109 is patterned to form openings and expose the first contact pads 107. In an embodiment the first protective layer 109 may be patterned using, e.g., a photolithographic masking and etching process. In such a process, a first photoresist (not individually illustrated in FIG. 1) is applied to the first protective layer 109 and then exposed to a patterned light source. The light source will impinge upon the first photoresist and induce a change in a property of the first photoresist, which is then utilized to selectively remove either the exposed portion or the unexposed portion and expose the first protective layer 109. The first photoresist is then utilized as a mask during, e.g., an etching process which removes portions of the first protective layer 109 to expose the first contact pads 107. Once the first protective layer 109 has been patterned, the first photoresist may be removed using, e.g., an ashing process.

FIG. 1 additionally illustrates the first die 111 bonded to and in electrical connection with the first wafer 100. The first die 111 may also be a CMOS device, and may comprise analog devices, logic devices, memory devices, eFlash devices, MEMS devices, combinations of these, or the like. However, any suitable devices may be within the first die 111. Additionally, the first die 111 may also have already been tested, and is a known good die chosen for further processing.

In an embodiment the first die 111 comprises a second substrate 113, a second active device layer 115, second metallization layers 117, second contact pads 119, and first external connections 121. In an embodiment the second substrate 113, the second active device layer 115, the second metallization layers 117, and the second contact pads 119 may be similar to the first substrate 101, the first active device layer 103, the first metallization layers 105, and the first contact pads 107, respectively, as described above.

The first external connections 121 provide an electrical connection between the first die 111 and, e.g., the first wafer 100 to which it will be bonded. In an embodiment the first external connections 121 may be contact bumps such as microbumps or controlled collapse chip connection (C4) bumps and may comprise a material such as tin, or other suitable materials, such as silver or copper. In an embodiment in which the first external connections 121 are tin solder bumps, the first external connections 121 may be formed by initially forming a layer of tin through any suitable method such as evaporation, electroplating, printing, solder transfer, ball placement, etc, to a thickness of, e.g., about 100 μm. Once a layer of tin has been formed on the structure, a reflow is performed in order to shape the material into the desired bump shape.

FIG. 1 further illustrates a bonding of the first die 111 to the first wafer 100. In an embodiment the first die 111 may be bonded to the first wafer 100 by initially aligning the first external connections 121 with corresponding ones of the first contact pads 107. Once in contact, a reflow may be performed to reflow the material of the first external connections 121 and electrically bond the first die 111 to the first wafer 100. However, any other suitable method of bonding, such as copper-copper bonding, may alternatively be utilized based upon the chosen structure of the first external connections 121, and all such bonding methods are fully intended to be included within the scope of the embodiments.

Figure 2:
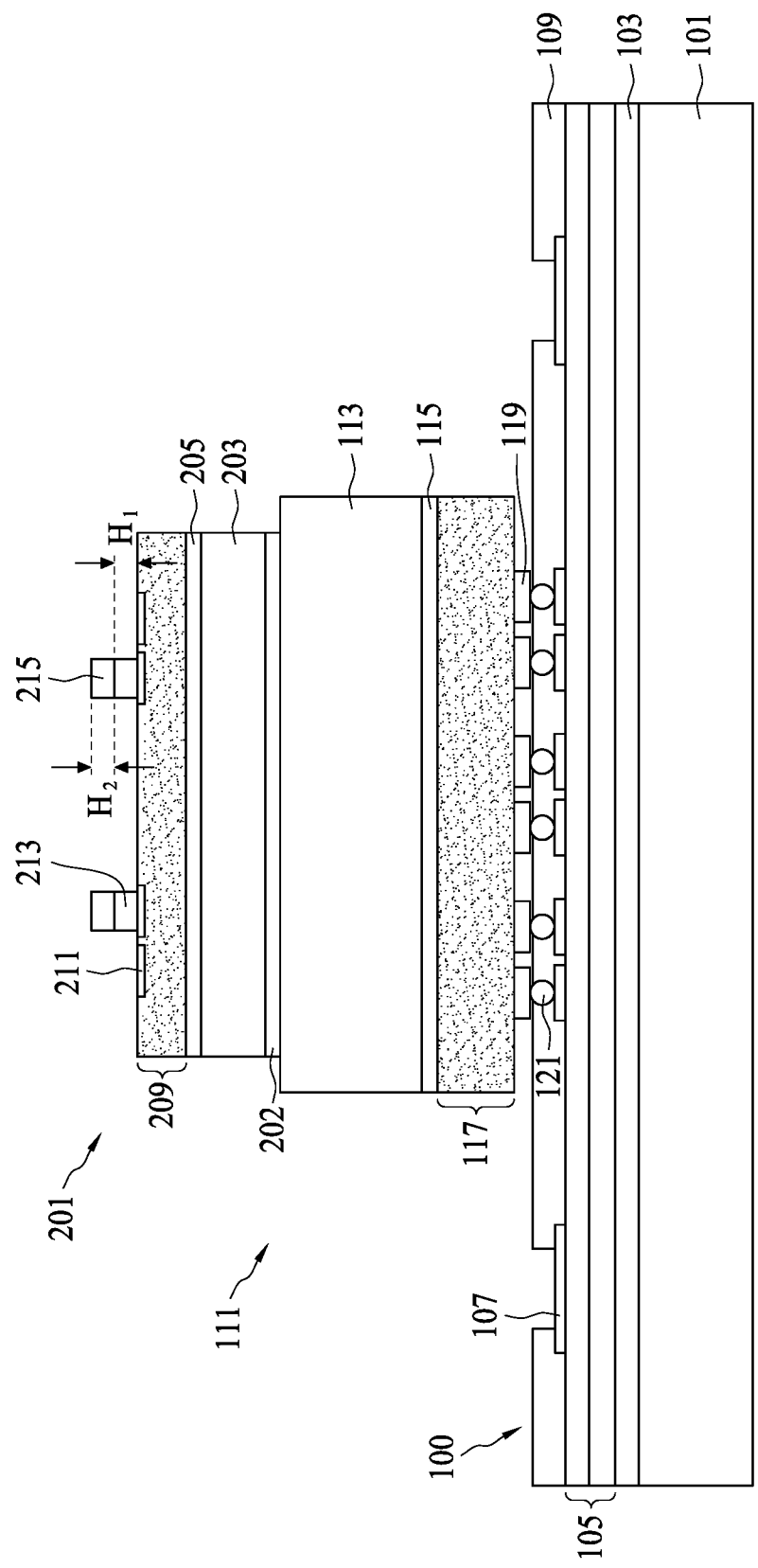
FIG. 2 illustrates a second die connected to the first die, in accordance with some embodiments.

FIG. 2 illustrates a placement of a second die 201 on the first die 111 in a back-to-back configuration, wherein the second active device layer 115 and the third active device layer 205 are facing away from each other. In an embodiment the second die 201 comprises, for example, a MEMS device that utilizes a microelectromechanical structure. However, the second die 201 is not limited to a MEMS die, and may alternatively comprise a logic device, a memory device, an analog device, an eFlash device, combinations of these, or the like. Additionally, in an embodiment the second die 201 has a smaller width than the first die 111, which has a smaller width than the third die 607 (described further below with respect to FIG. 6), although any suitable widths may alternatively be utilized.

In an embodiment the second die 201 comprises a third substrate 203, a third active device layer 205, third metallization layers 209, and third contact pads 211. In an embodiment the third substrate 203, the third active device layer 205, the third metallization layers 209, and the third contact pads 211 may be similar to the first substrate 101, the first active device layer 103, the first metallization layers 105, and the first contact pads 107 (described above with respect to FIG. 1), respectively. However, the third substrate 203, the third active device layer 205, the third metallization layers 209, and the third contact pads 211 may alternatively be formed from different materials or using different processes than the first substrate 101, the first active device layer 103, the first metallization layers 105, and the first contact pads 107.

Additionally, the second die 201 comprises second external connections 213 topped by conductive pads 215 located on respective ones of the third contact pads 211 (while leaving other ones of the third contact pads 211 uncovered and exposed). In an embodiment the second external connections 213 comprise conductive pillars, such as copper pillars. In an embodiment the second external connections 213 may be formed by initially forming and patterning a second photoresist (not shown) over the second die 201. The second external connections 213 may be formed within the pattern of the second photoresist by first forming a seed layer (not shown) and then forming the second external connections 213 using the seed layer as an initiator. The second external connections 213 may be formed from a conductive material such as copper, although other conductive materials such as nickel, titanium (Ti), vanadium (V), or aluminum (Al), combinations of these, and the like may also be used. Additionally, the second external connections 213 may be formed using a process such as electroplating, by a combination of current and immersion within a solution deposit, e.g., copper within the openings of the second photoresist in order to fill and/or overfill the openings of the photoresist, thereby forming the conductive pillar. After the second external connections 213 have been formed, the second photoresist may be removed.

In an embodiment the second external connections 213 are formed so as to not extend through a subsequently applied encapsulant 401 (not illustrated in FIG. 2 but illustrated and described below with respect to FIG. 4). As such, the second external connections 213 may have a first height $H_1$ of between about 40 µm and about 60 µm, such as about 50 µm. However, any other suitable height may alternatively be utilized.

The conductive pads 215 provide a surface for connection between the second external connections 213 and fourth external connections 603 (not illustrated in FIG. 2 but illustrated and described below with respect to FIG. 6). In an embodiment the conductive pads 215 are a solder material such as SnAg or any other suitable material. The conductive pads 215 may have a second height $H_2$ of between about 10 µm and about 20 µm, such as about 15 µm.

The second die 201 may be adhered to the first die 111 using, e.g., a first adhesive layer 202. In an embodiment the first adhesive layer 202 may comprise a glue. However, other types of adhesives, such as pressure sensitive adhesives, radiation curable adhesives, epoxies, combinations of these, or the like, may also be used. The first adhesive layer 202 may be placed onto the first die 111 or the second die 201 in a semi-liquid or gel form, which is readily deformable under pressure.

Figure 3:
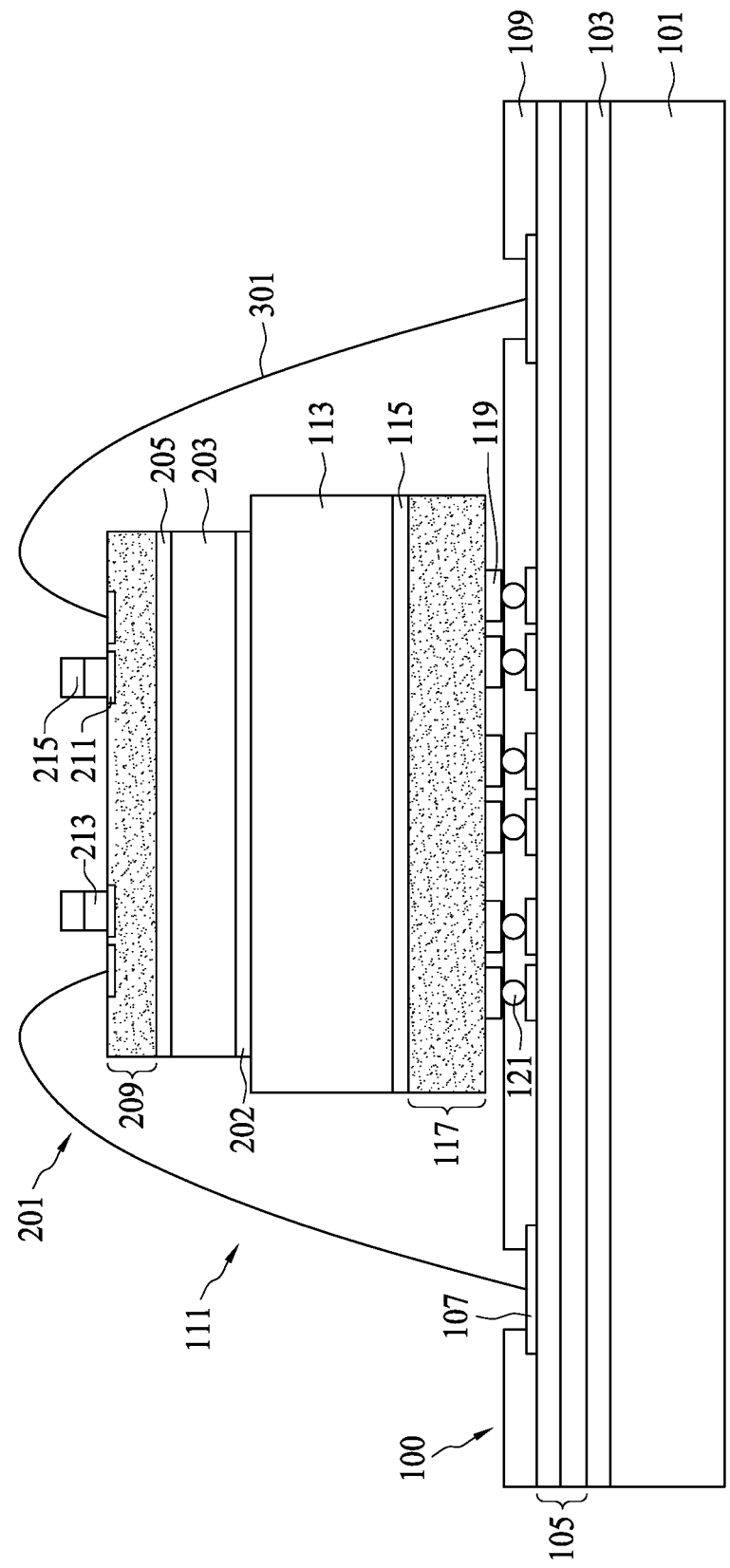
FIG. 3 illustrates a connection of the second die to the first wafer and a formation of external connections, in accordance with some embodiments.

FIG. 3 illustrates an electrical bonding process between the second die 201 and the first wafer 100. In an embodiment a first wire bond 301 is utilized to connect one of the third contact pads 211 uncovered by the second external connections 213 with one of the first contact pads 107 on the first wafer 100. In an embodiment an electronic flame off (EFO) wand may be used to raise the temperature of a gold wire (not individually illustrated in FIG. 3) within a capillary controlled by a wire clamp (also not individually illustrated in FIG. 3). Once the temperature of the gold wire is raised to between about 150° C. and about 250° C., the gold wire is contacted to the second die 201 to form a first connection and then the gold wire is moved to the first contact pad 107 to form a second connection. Once connected, the remainder of the gold wire is separated from the connected portions to form the first wire bond 301. The connection process may be repeated to form as many connections as desired.

Figure 4:
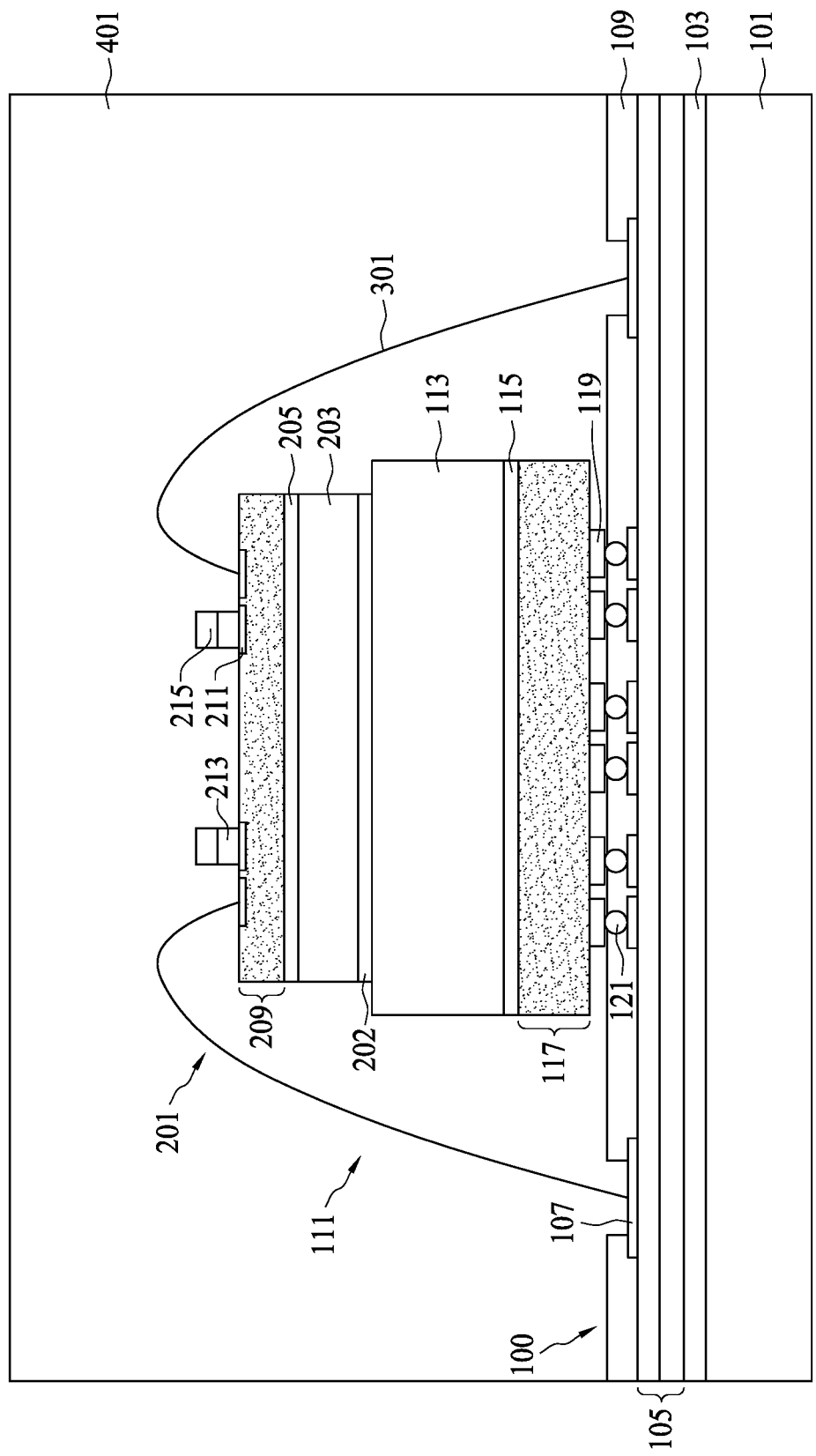
FIG. 4 illustrates an encapsulation of the first die and the second die, in accordance with some embodiments.

FIG. 4 illustrates a placement of an encapsulant 401 over the first die 111 and the second die 201 and in physical contact with the first wafer 100 in order to encapsulate and protect the first die 111 and the second die 201. In an embodiment the encapsulant 401 may be a molding compound and may be placed using a molding device (not illustrated in FIG. 4). For example, the first wafer 100, the first die 111, and the second die 201 may be placed within a cavity of the molding device, and the cavity may be hermetically sealed. The encapsulant 401 may be placed within the cavity either before the cavity is hermetically sealed or else may be injected into the cavity through an injection port. In an embodiment the encapsulant 401 may be a molding compound resin such as polyimide, PPS, PEEK, PES, a heat resistant crystal resin, combinations of these, or the like.

Once the encapsulant 401 has been placed into the cavity such that the encapsulant 401 encapsulates the region around the first die 111, the second die 201, and the first wafer 100, the encapsulant 401 may be cured in order to harden the encapsulant 401 for optimum protection. While the exact curing process is dependent at least in part on the particular material chosen for the encapsulant 401, in an embodiment in which molding compound is chosen as the encapsulant 401, the curing could occur through a process such as heating the encapsulant 401 to between about 100° C. and about 130° C., such as about 125° C. for about 60 sec to about 3000 sec, such as about 600 sec. Additionally, initiators and/or catalysts may be included within the encapsulant 401 to better control the curing process.

However, as one having ordinary skill in the art will recognize, the curing process described above is merely an exemplary process and is not meant to limit the current embodiments. Other curing processes, such as irradiation or even allowing the encapsulant 401 to harden at ambient temperature, may alternatively be used. Any suitable curing process may be used, and all such processes are fully intended to be included within the scope of the embodiments discussed herein.

Figure 5:
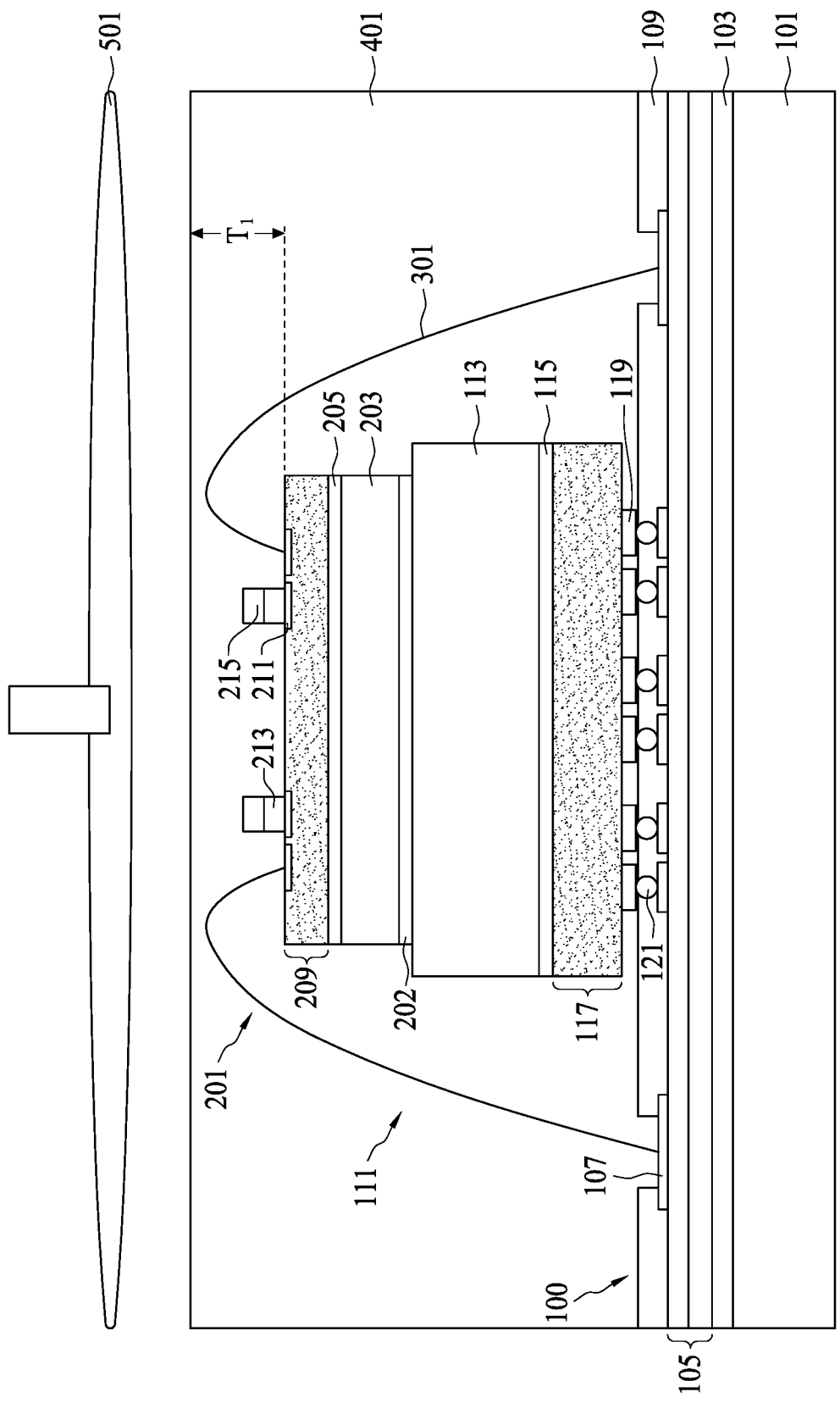
FIG. 5 illustrates a grinding of the encapsulant, in accordance with some embodiments.

FIG. 5 illustrates an optional thinning of the encapsulant 401. In an embodiment the thinning may be performed, e.g., using a mechanical grinding or chemical mechanical polishing (CMP) process (represented in FIG. 5 by the rotating pad labeled 501) whereby chemical etchants and abrasives are utilized to react and grind away the encapsulant 401. The encapsulant 401 may be thinned until the encapsulant 401 has a first thickness $T_1$ over the second die 201 of between about 100 µm and about 200 µm, such as about 150 µm.

However, while the CMP process described above is presented as one illustrative embodiment, it is not intended to be limiting to the embodiments. Any other suitable removal process may alternatively be used to thin the encapsulant 401. For example, a chemical etch or a series of chemical etches may alternatively be utilized. This process and any other suitable process may alternatively be utilized to thin the encapsulant 401, and all such processes are fully intended to be included within the scope of the embodiments.

Figure 6:
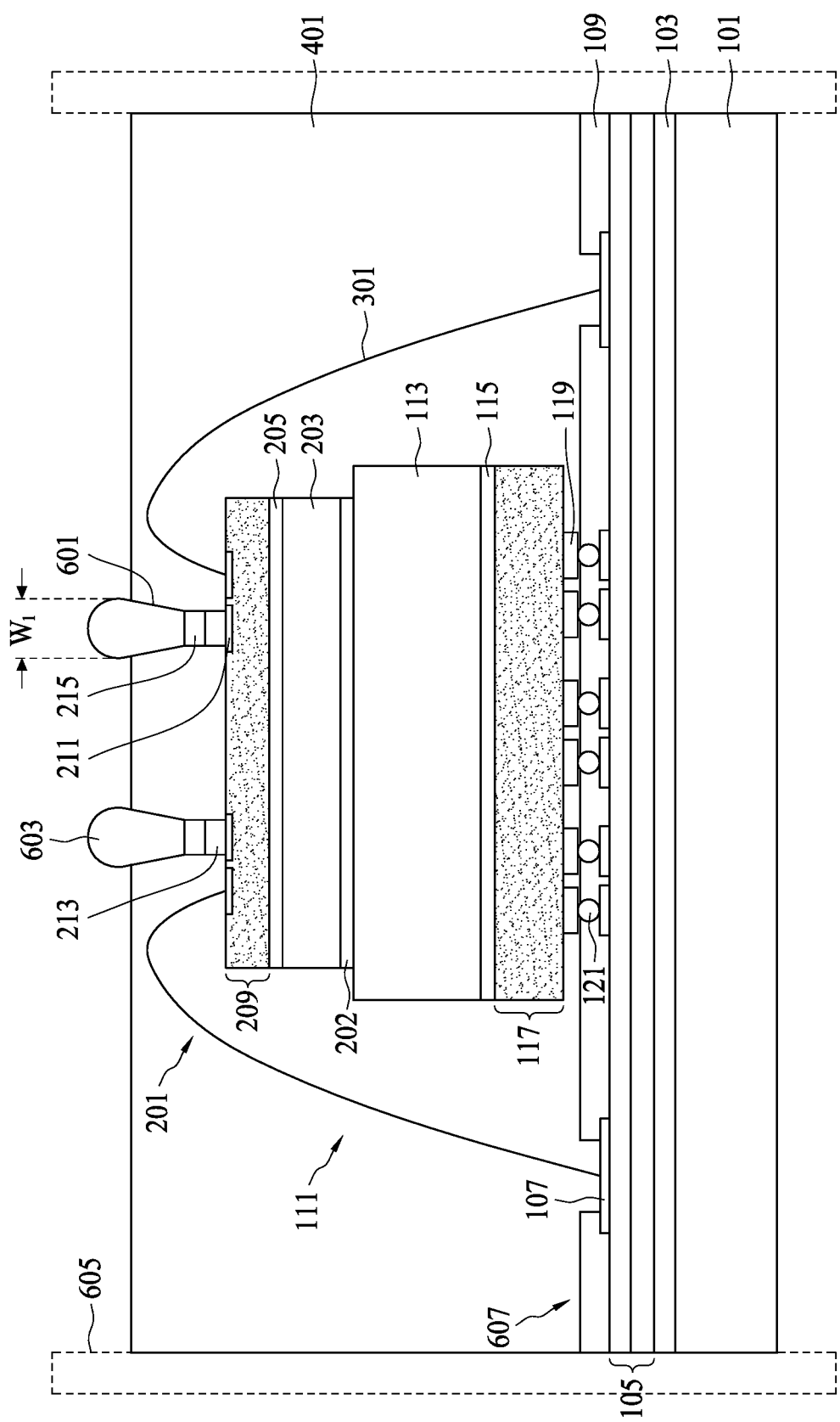
FIG. 6 illustrates an exposure of the external connections and a singulation of the first wafer to form a third die, in accordance with some embodiments.

FIG. 6 illustrates that, once the encapsulant 401 has been thinned, first openings 601 may be formed through the encapsulant 401 in order to expose the conductive pads 215. In an embodiment the first openings 601 may be formed using, e.g., a laser drilling process. For example, in the laser drilling process, such as a laser ablation process, a laser beam (not individually illustrated in FIG. 6) is applied to the top surface of the encapsulant 401. As a result, portions of the encapsulant 401 are removed to form the first openings 601. The first openings 601 may be formed to have a first width $W_1$ of between about 20 µm and about 250 µm, such as about 150 µm.

However, as one of ordinary skill will recognize, the use of a laser drilling process is simply one suitable method for forming the first openings 601 and is intended to be illustrative and not limiting upon the embodiments. Rather, any suitable method for forming the first openings 601, including a photolithographic masking and etching process, may alternatively be used. All such methods are fully intended to be included within the scope of the embodiments.

FIG. 6 additionally illustrates a placement of fourth external connections 603 in physical and electrical connection with the conductive pads 215. In an embodiment the fourth external connections 603 may be, e.g., a contact bump made from a material such as silver, lead-free tin, or copper. In an embodiment in which the fourth external connections 603 are tin solder bumps, the fourth external connections 603 may be formed by initially placing or forming a layer of tin through such commonly used methods such as ball placement, evaporation, electroplating, printing, solder transfer, etc, to a thickness of, e.g., about 100 µm. Once a layer of tin has been formed on the structure, a reflow may be performed in order to shape the material into the desired bump shape and fill the first openings 601.

FIG. 6 additionally illustrates a singulation of the first wafer 100 into separate components, separating a third die 607 from the first wafer 100. In an embodiment a laser may be used to form grooves within the encapsulant 401 and the first wafer 100. Once the grooves have been formed, the singulation may be performed by using a saw blade (represented in FIG. 6 by the dashed boxes labeled 605) to slice the first wafer 100, thereby separating the first wafer 100 into separate components.

However, as one of ordinary skill in the art will recognize, utilizing the saw blade 605 to singulate the first wafer 100 is merely one illustrative embodiment and is not intended to be limiting. Alternative methods for singulating the first wafer 100, such as utilizing one or more etches to separate the first wafer 100, may alternatively be utilized. These methods and any other suitable methods may alternatively be utilized to singulate the first wafer 100.

Figure 7:
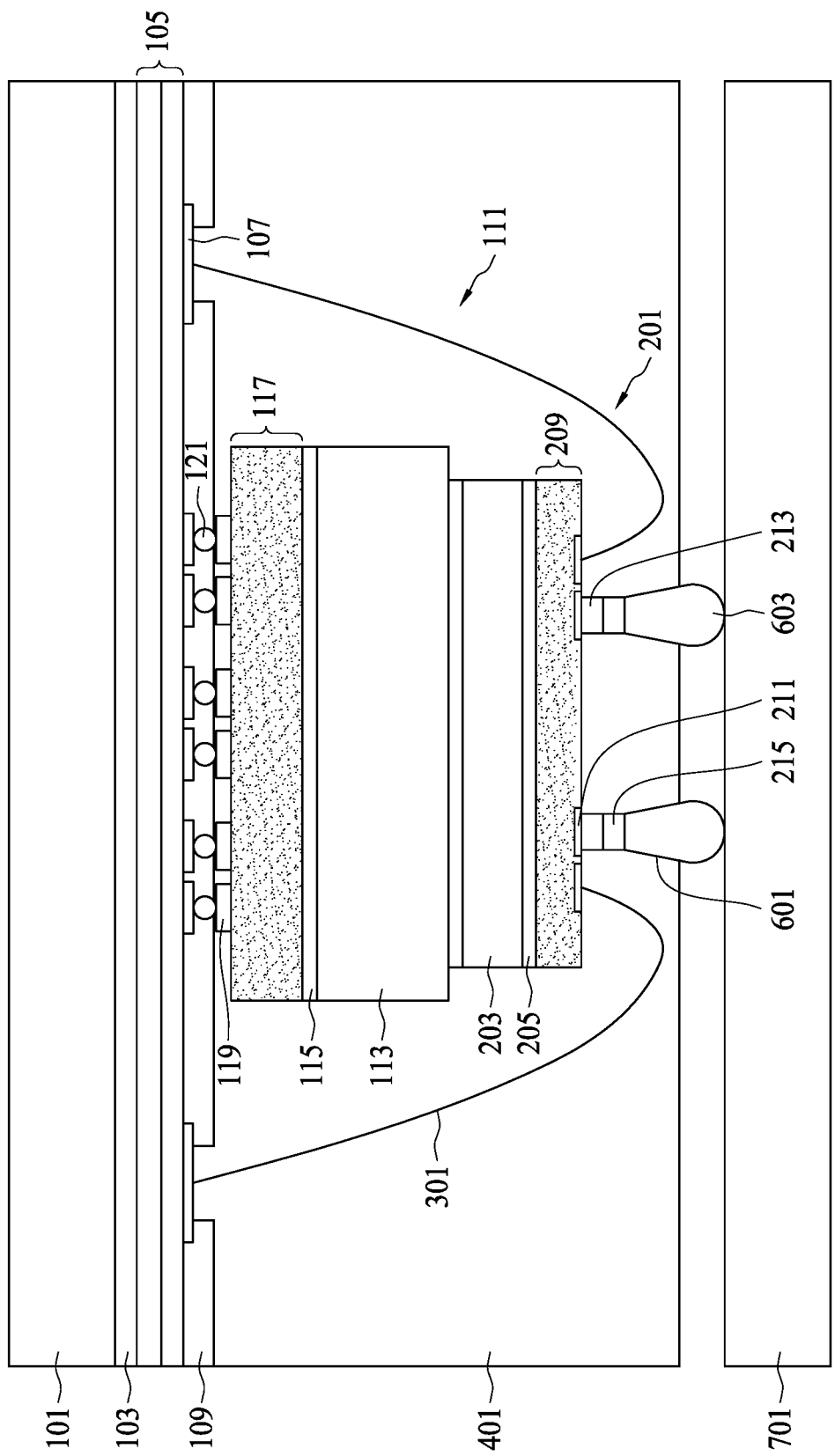
FIG. 7 illustrates a bonding of the second die with a substrate, in accordance with some embodiments.

FIG. 7 illustrates a placement of the first die 111, the second die 201, and the third die 607 onto a fourth substrate 701. In an embodiment the fourth substrate 701 may be, e.g., a printed circuit board that works to interconnect various electrical components to each other in order to provide a desired functionality for a user. Alternatively, the fourth substrate 701 may be another substrate and comprises multiple conductive layers (not individually illustrated), some of which are inter-layers within the third substrate. These layers may be etched into traces of various widths and lengths and connected through inter-layer vias. Together, the lines and vias may form an electrical network to route DC power, ground, and signals from one side of the fourth substrate 701 to the other. Those of skill in the art will recognize the fourth substrate 701 may be fabricated from an organic (laminate) material such as bismaleimide-triazine (BT), a polymer-based material such as liquid-crystal polymer (LCP), a ceramic material such as low-temperature co-fired ceramic (LTCC), a silicon or glass interposer, or the like. Those of skill in the art will also recognize that the conductive layers and vias may be formed from any suitable conductive material, such as copper, aluminum, silver, gold, other metals, alloys, combination thereof, and/or the like, and formed by any suitable technique, such as electrochemical plating (ECP), electroless plating, other deposition methods such as sputtering, printing, and chemical vapor deposition (CVD) methods, or the like.

In some embodiments, the fourth substrate 701 may also include electrical elements, such as resistors, capacitors, signal distribution circuitry, combinations of these, or the like. These electrical elements may be active, passive, or a combination thereof. In other embodiments, the fourth substrate 701 is free from both active and passive electrical elements therein. All such combinations are fully intended to be included within the scope of the embodiments.

In an embodiment the first die 111, the second die 201, and the third die 607 may be bonded to the fourth substrate 701. For example, in an embodiment the fourth external connections 603 may be aligned and placed into physical contact with corresponding electrical connections (not separately illustrated in FIG. 7) of the fourth substrate 701. Once in place and aligned, the fourth external connections 603 may be reflowed in order to physically and electrically bond the fourth external connections 603 (and, as such, the first die 111, the second die 201, and the third die 607) to the fourth substrate 701.

By utilizing the processes as described above with respect to FIGS. 1-7, the use of a separate substrate during the packaging process may be skipped. As such, the costs of the substrate utilized, which may be between about 20% and 30% of the costs for packaging, may be saved. Additionally, the final structure is a packaging substrate-less structure.

Figure 8:
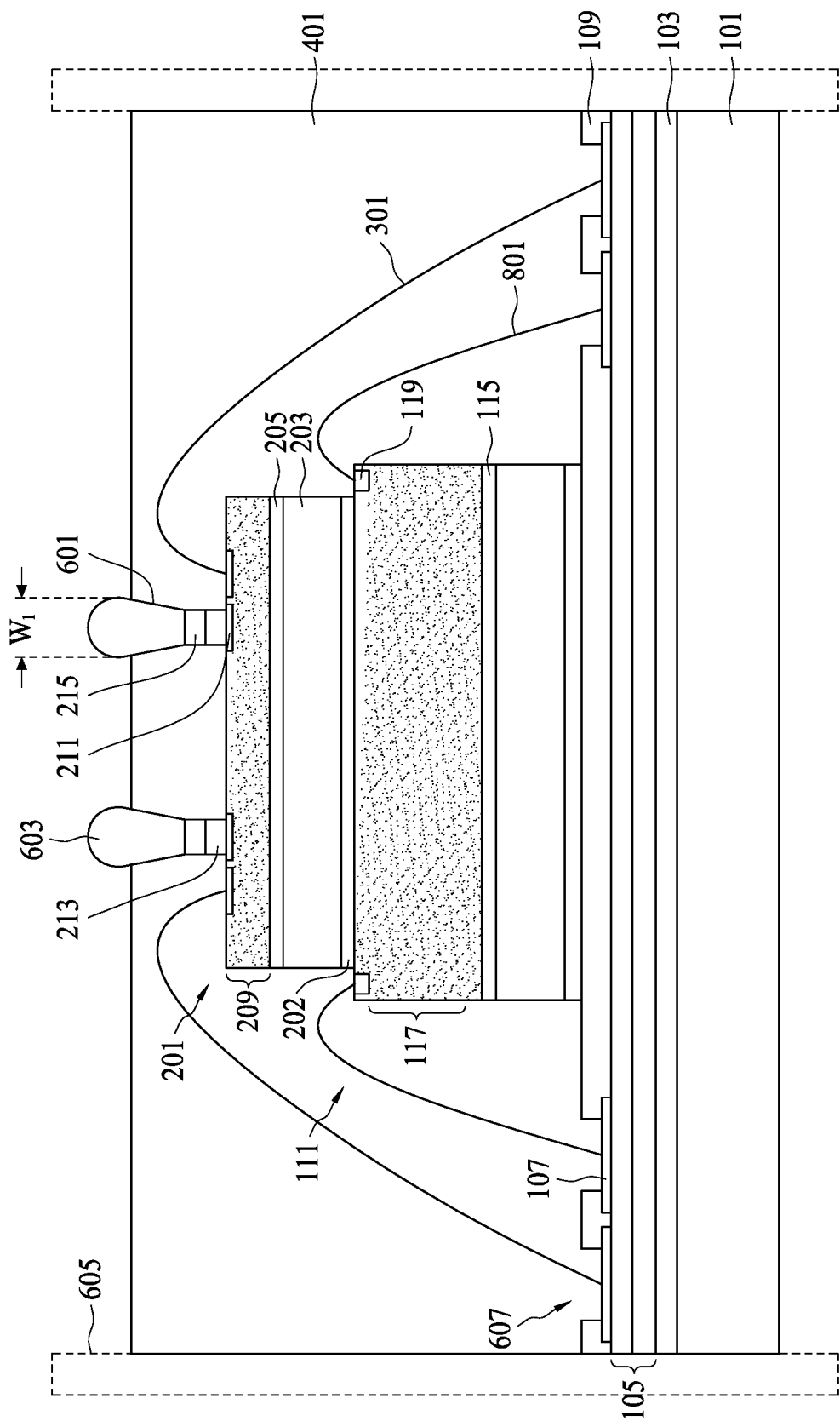
FIG. 8 illustrates an embodiment in which the first die and the third die are in a front-to-back configuration, in accordance with some embodiments.

FIG. 8 illustrates another embodiment of an architecture of the first die 111, the second die 201, and the third die 607. In this embodiment, instead of the face-to-face configuration of the first die 111 and the third die 607 and the back-to-back configuration of the first die 111 and the second die 201 (as illustrated in FIGS. 1-8), the first die 111 and the third die 607 are arranged in a face-to-back configuration. For example, the first die 111 may have the second active device layer 115 facing away from the third die 607, while the third die 607 has the first active device layer 103 facing towards the first die 111. The first die 111 may be attached to the third die 607 utilizing a second adhesive layer 803, which may be similar to the first adhesive layer 202 (described above with respect to FIG. 2).

In this embodiment, instead of the first external connections 121 providing an electrical connection between the second contact pads 119 and the first contact pads 107, the second contact pads 119 are electrically connected to the third die 607 through a second wire bond 801. In particular, the second wire bond 801 is formed between the second contact pads 119 (on a surface of the first die 111 facing away from the third die 607) and a corresponding one of the first contact pads 107 located on the third die 607. In an embodiment the second wire bond 801 may be similar to the first wire bond 301 (described above with respect to FIG. 3), such as by being a gold wire, although any other suitable material may alternatively be utilized.

Additionally, in this embodiment the second die 201 maintains its orientation and maintains it connection to the third die 607. For example, the second die 201 may be connected to the third die 607 through, e.g., the first wire bond 301. However, with the change in orientation of the first die 111, the first die 111 and the second die 201 are now in a face-to-back configuration.

Figure 9:
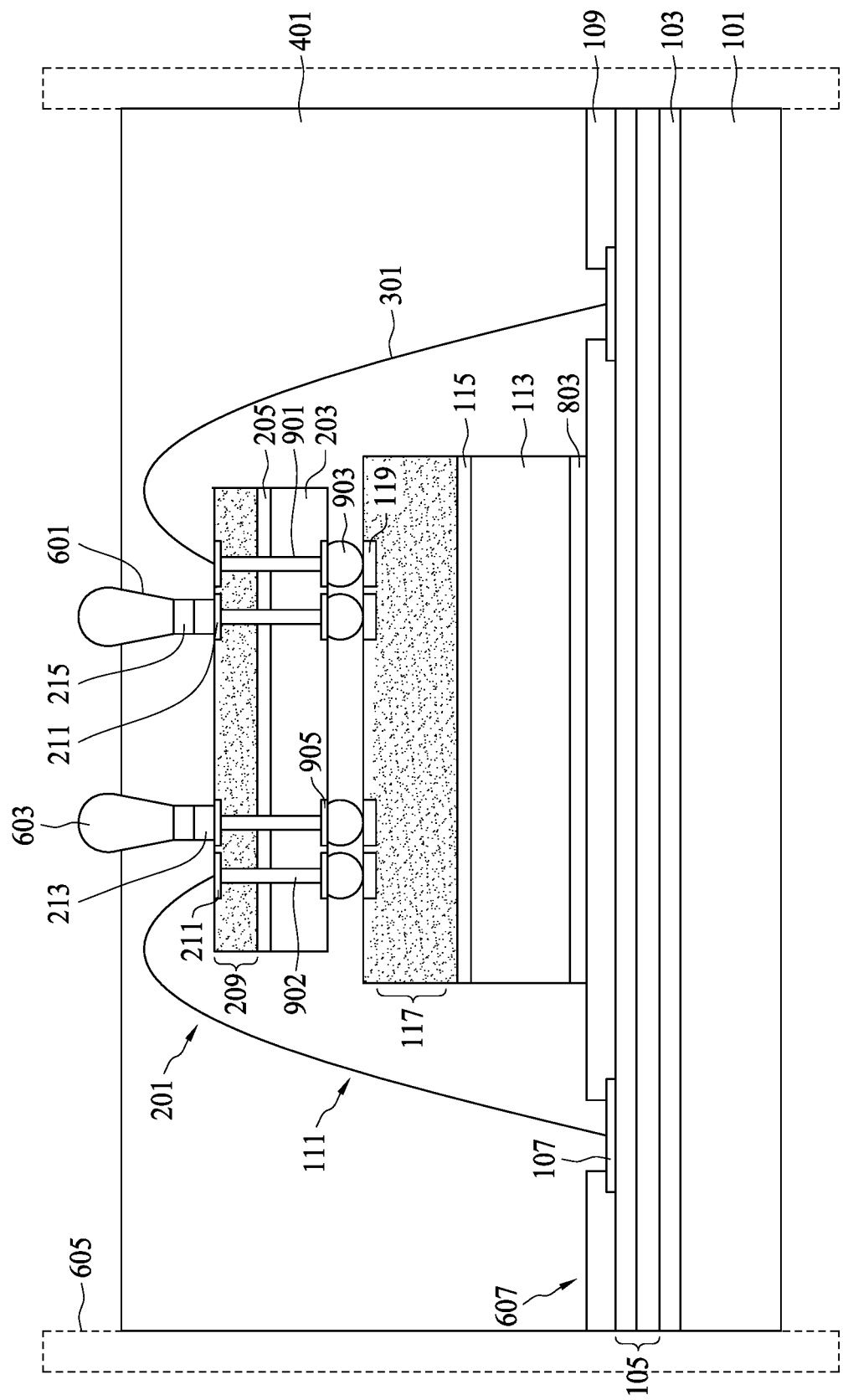
FIG. 9 illustrates an embodiment in which the first die is electrically connected to the third die through vias that extend through the second die, in accordance with some embodiments.

FIG. 9 illustrates yet another embodiment wherein the first die 111, the second die 201, and the third die 607 are orientated as described above with respect to FIG. 8 (e.g., the first die 111 and the third die 607 are in a face-to-back orientation and the second die 201 and the first die 111 are in a face-to-back orientation). However, in this embodiment, instead of using the second wire bonds 801, the first die 111 is electrically connected to the third die 607 through the second die 201.

In an embodiment the first die 111 is electrically connected to the third die 607 through the second die 201 using, e.g., through substrate vias (TSVs) 901 that extend through the second die 201. The TSVs 901 may be formed through the second die 201 prior to the second die 201 being adhered or bonded to the first die 111, and the process for forming them may start by initially applying and developing a suitable third photoresist (which may be similar to the first photoresist discussed above), and then etching the second die 201 to generate TSV openings. The openings for the TSVs 901 at this stage may be formed so as to extend through the third metallization layers 209, the third active device layer 205 and into the third substrate 203 to a depth at least greater than the eventual desired height of the finished second die 201. Accordingly, while the depth is dependent upon the overall design of the second die 201, the depth may be between about 1 µm and about 700 µm below the surface on the third substrate 203, such as a depth of about 50 µm. The openings for the TSVs 901 may be formed to have a diameter of between about 1 µm and about 100 µm, such as about 6 µm.

Once the openings for the TSVs 901 have been formed, the openings for the TSVs 901 may be filled with, e.g., a barrier layer (not separately illustrated) and a conductive material 902. The barrier layer may comprise a conductive material such as titanium nitride, although other materials, such as tantalum nitride, titanium, a dielectric, or the like may alternatively be utilized. The barrier layer may be formed using a CVD process, such as PECVD. However, other alternative processes, such as sputtering or metal organic chemical vapor deposition (MOCVD), may alternatively be used. The barrier layer may be formed so as to contour to the underlying shape of the opening for the TSVs 901.

The conductive material 902 may comprise copper, although other suitable materials such as aluminum, alloys, doped polysilicon, combinations thereof, and the like, may alternatively be utilized. The conductive material 902 may be formed by depositing a seed layer and then electroplating copper onto the seed layer, filling and overfilling the openings for the TSVs 901. Once the openings for the TSVs 901 have been filled, excess barrier layer and excess conductive material 902 outside of the openings for the TSVs 901 may be removed through a grinding process such as chemical mechanical polishing (CMP), although any suitable removal process may be used.

Once the conductive material 902 is within the openings for the TSVs 901, a thinning of the second side of the third substrate 203 may be performed in order to expose the openings for the TSVs 901 and form the TSVs 901 from the conductive material 902 that extends through the third substrate 203. In an embodiment, the thinning of the second side of the third substrate 203 may leave the TSVs 901. The thinning of the second side of the third substrate 203 may be performed by a planarization process such as CMP or etching.

However, as one of ordinary skill in the art will recognize, the above described process for forming the TSVs 901 is merely one method of forming the TSVs 901, and other methods are also fully intended to be included within the scope of the embodiments. For example, forming the openings for the TSVs 901, filling the openings for the TSVs 901 with a dielectric material, thinning the second side of the third substrate 203 to expose the dielectric material, removing the dielectric material, and filling the openings for the TSVs 901 with a conductor may also be used. This and all other suitable methods for forming the TSVs 901 into the third substrate 203 are fully intended to be included within the scope of the embodiments.

Once the TSVs 901 have been formed, the third contact pads 211 may be formed in physical and/or electrical connection with the TSVs 901. In an embodiment the third contact pads 211 may be formed as described above with respect to FIG. 2. However, any suitable material and process may alternatively be utilized.

Additionally, on an opposite side of the second die 201 (e.g., the side that will eventually face the first die 111), once the TSVs 901 are formed through the second die 201, fourth contact pads 905 are formed on an opposite side of the third substrate 203 than the third active device layer 205 and in electrical connection with the TSVs 901. In an embodiment the fourth contact pads 905 are formed of a conductive material such as aluminum, although other suitable materials, such as copper, tungsten, or the like, may alternatively be utilized. The fourth contact pads 905 may be formed using a process such as CVD or PVD, although other suitable materials and methods may alternatively be utilized. Once the material for the fourth contact pads 905 has been deposited, the material may be shaped into the fourth contact pads 905 using, e.g., a photolithographic masking and etching process.

Fifth external connections 903 may be formed to provide an electrical connection between the second die 201 and the first die 111. In an embodiment the fifth external connections 903 may be contact bumps such as microbumps or controlled collapse chip connection (C4) bumps and may comprise a material such as tin, or other suitable materials, such as silver or copper. In an embodiment in which the fifth external connections 903 are tin solder bumps, the fifth external connections 903 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

Once the fifth external connections 903 have been formed, the second die 201 is bonded to the first die 111. In an embodiment the bonding is performed by initially aligning the fifth external connections 903 with corresponding ones of the second contact pads 119. Once the fifth external connections 903 are aligned and in physical contact with the second contact pads 119, the fifth external connections 903 are reflowed in order to bond the second die 201 with the first die 111.

Once the first die 111 and the second die 201 have been bonded, the first wire bonds 301 may be attached, the encapsulant 401 may be placed, and the fourth external connections 603 may be formed. However, in this embodiment the first die 111 is electrically connected to both the third die 607 and the fourth external connections 603 through the TSVs 901 that extend through the second die 201.

Figure 10:
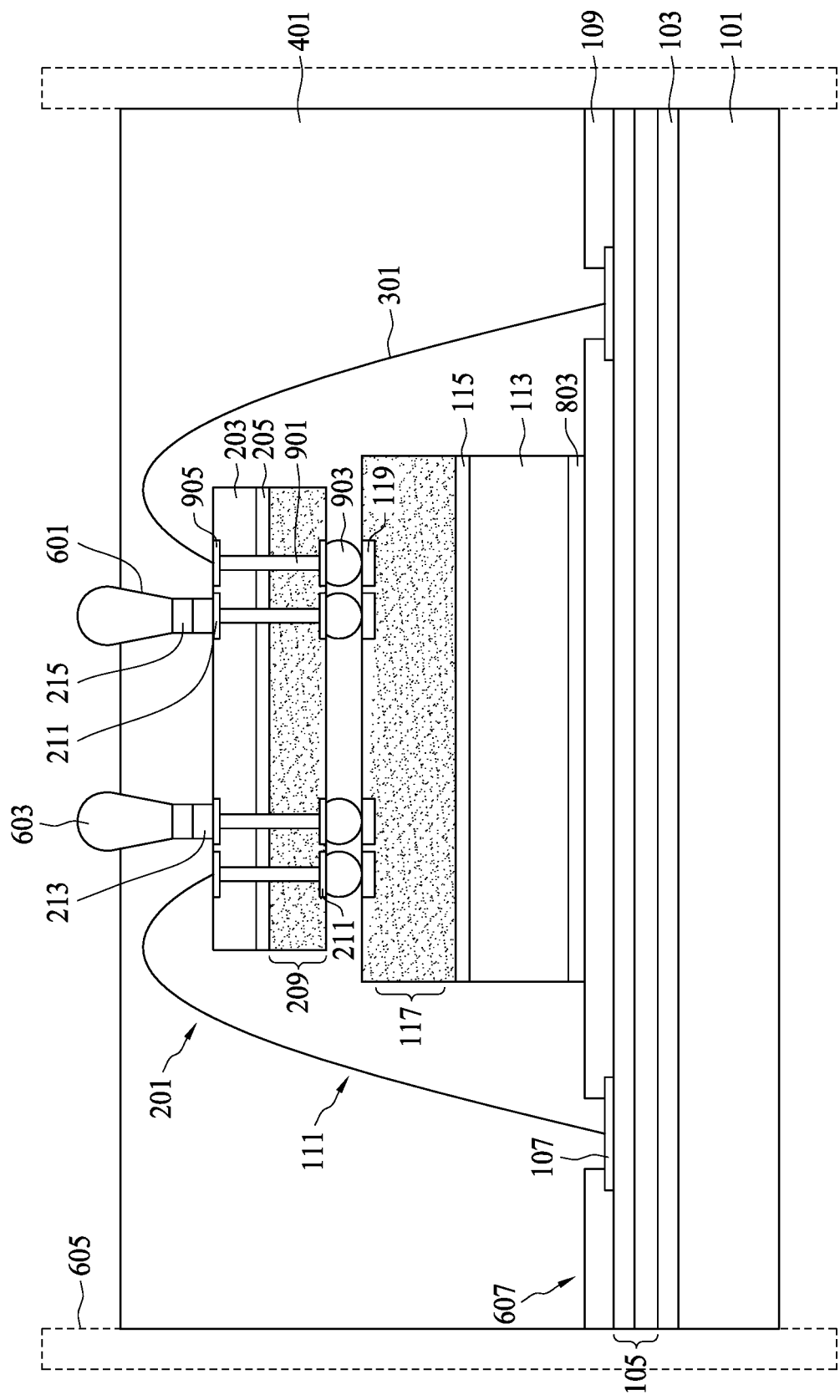
FIG. 10 illustrates an embodiment in which the first die and the second die are in a face-to-face configuration, in accordance with some embodiments.

FIG. 10 illustrates yet another embodiment similar to the embodiment described above with respect to FIG. 9, which includes the first die 111 being electrically connected to the third die 607 and the fourth external connections 603 using TSVs 901 that extend through the second die 201. In this embodiment, however, the second die 201 is orientated such that the third active device layer 205 faces the first die 111 such that the first die 111 and the second die 201 are in a face-to-face orientation with each other.

Additionally in this embodiment the fifth external connections 903 may be formed in connection with the TSVs 901 on the side of the second die 201 that will be bonded to the first die 111. Once the fifth external connections 903 have been formed, the first die 111 and the second die 201 may be bonded together through the fifth external connections 903, the first wire bonds 301 may be placed, the encapsulant 401 may be placed, and the fourth external connections 603 may be formed as described above.

Figure 11A:
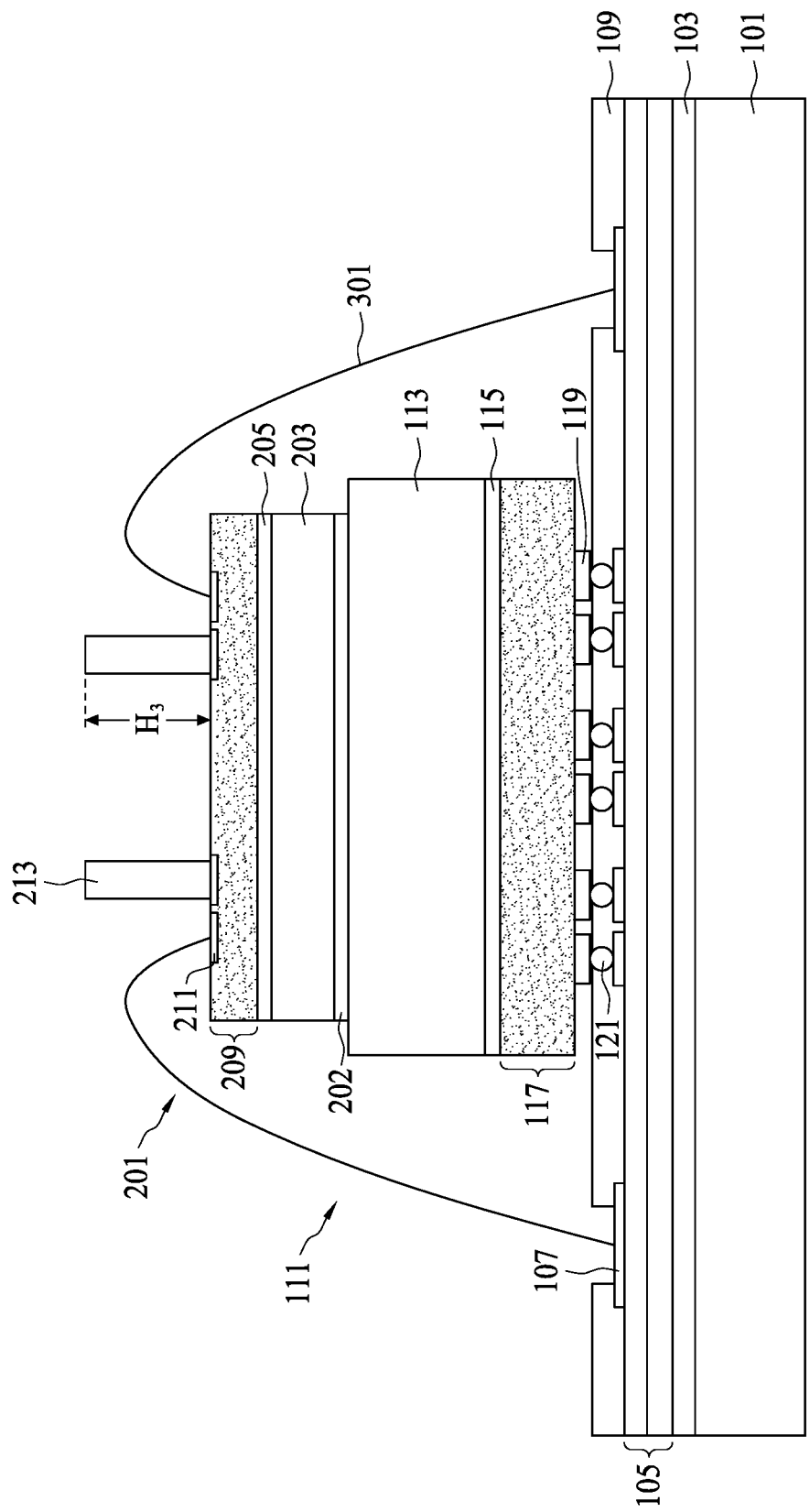
FIGS. 11A-11D illustrate embodiments that utilize a conductive pillar, in accordance with some embodiments.

FIG. 11A illustrates another embodiment in which, rather than forming the first openings 601 through the encapsulant 401 (see, e.g., FIG. 6), the second external connections 213 are formed as copper pillars that will extend through the encapsulant 401 after, e.g., the planarization process (discussed above with respect to FIG. 5). In an embodiment the second external connections 213 are formed as described above with respect to FIG. 2, but are formed to a third height of $H_3$ of between about 50 μm and about 200 μm, such as about 120 μm.

Figure 11B:
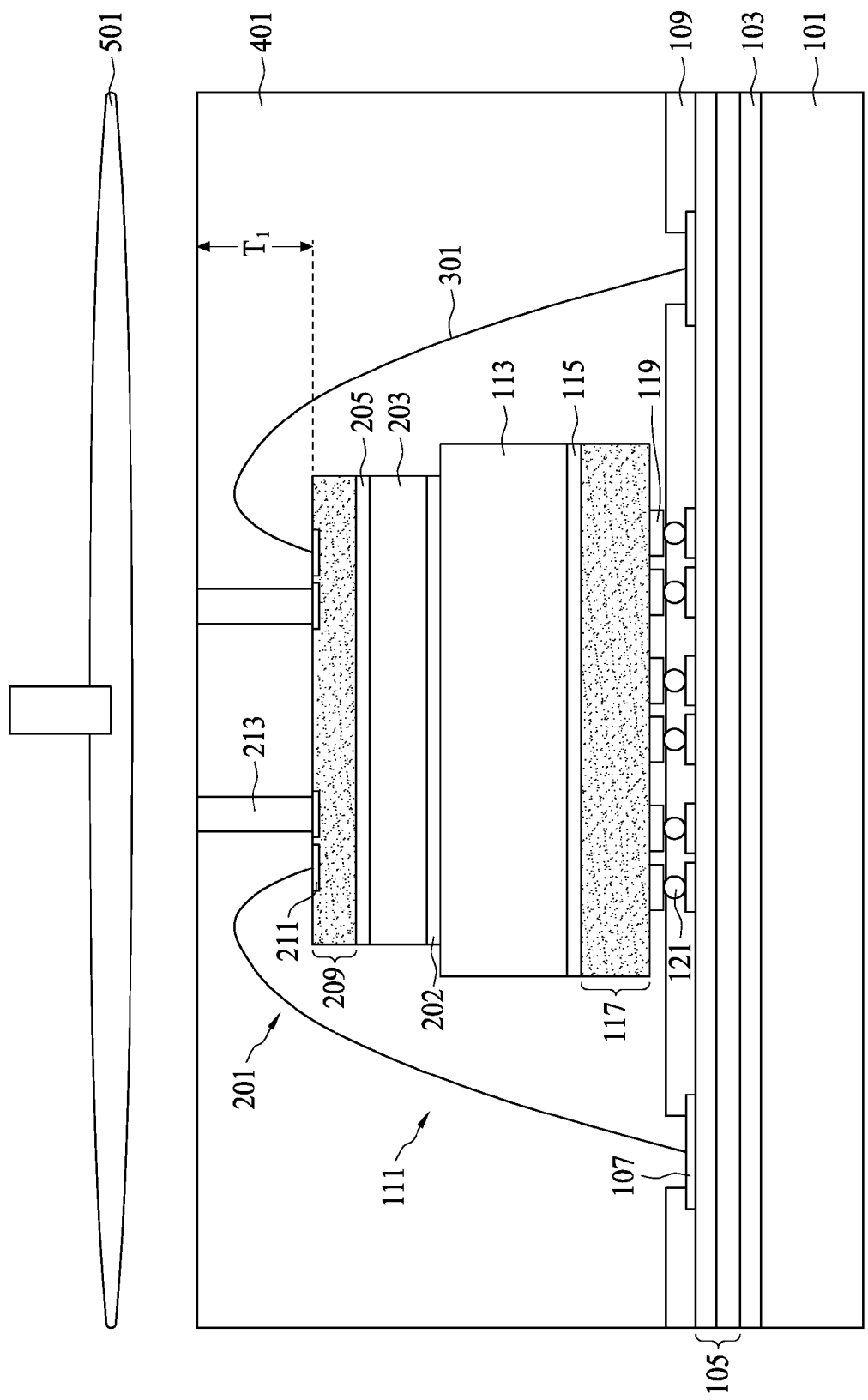

FIG. 11B illustrates that, after the second external connections 213 have been formed as conductive pillars, the encapsulant 401 may be placed over the first die 111, the second die 201, and the second external connections 213. In an embodiment the encapsulant 401 may be placed in a similar manner and using similar process as described above with respect to FIG. 4. For example, the first die 111 and the second die 201 may be placed into a molding chamber (not illustrated) and the encapsulant 401 is then injected into the molding chamber, followed by a curing of the encapsulant 401. However, any suitable encapsulation process may alternatively be utilized.

FIG. 11B also illustrates a thinning of the encapsulant 401 in order to expose the second external connections 213. In an embodiment the thinning may be performed, e.g., using a mechanical grinding or chemical mechanical polishing (CMP) process (represented in FIG. 11B by the rotating pad labeled 501) whereby chemical etchants and abrasives are utilized to react and grind away the encapsulant 401. The encapsulant 401 may be thinned until the encapsulant 401 has the first thickness $T_1$ over the second die 201 of between about 40 μm and about 180 μm, such as about 100 μm and until the second external connections 213 have been exposed.

However, while the CMP process described above is presented as one illustrative embodiment, it is not intended to be limiting to the embodiments. Any other suitable removal process may alternatively be used to thin the encapsulant 401. For example, a chemical etch or a series of chemical etches may alternatively be utilized. This process and any other suitable process may alternatively be utilized to thin the encapsulant 401, and all such processes are fully intended to be included within the scope of the embodiments.

Figure 11C:
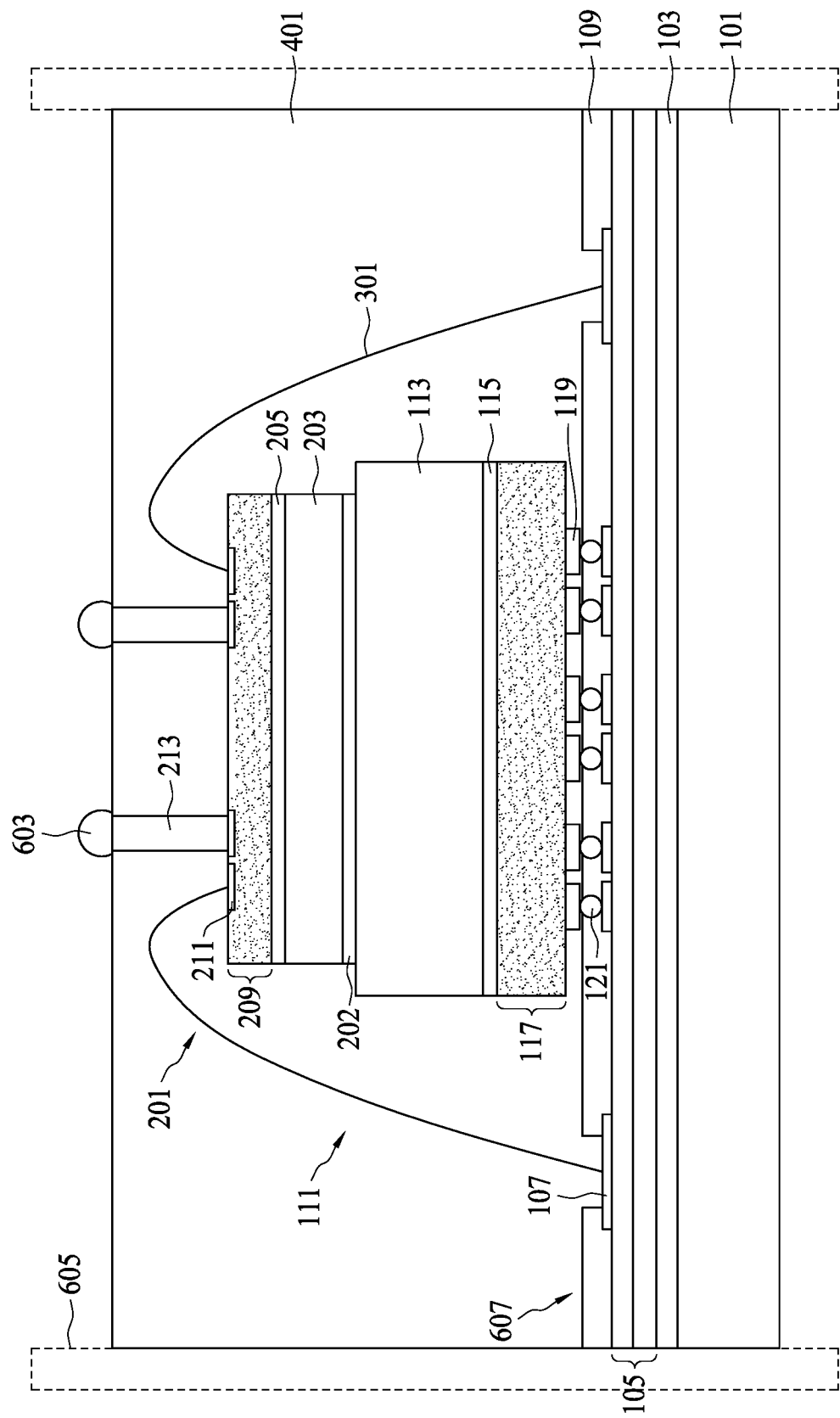

FIG. 11C illustrates a placement of the fourth external connections 603 in electrical connection with the second external connections 213 along with a singulation of the third die 607 from the remainder of the first wafer 100. In an embodiment the fourth external connections 603 may be placed as described above with respect to FIG. 6 (e.g., solder bumps). However, because the fourth external connections 603 are not placed within the first openings 601, the fourth external connections 603 will be formed and shaped on a top surface of the second external connections 213 and the encapsulant 401.

FIG. 11C also illustrates the singulation of the third die 607 from the remainder of the first wafer 100. In an embodiment the singulation may be performed as described above with respect to FIG. 6. For example, the saw blade 605 may be used to separate the first wafer 100 into different sections. However, any other suitable method of singulation may alternatively be utilized.

Figure 11D:
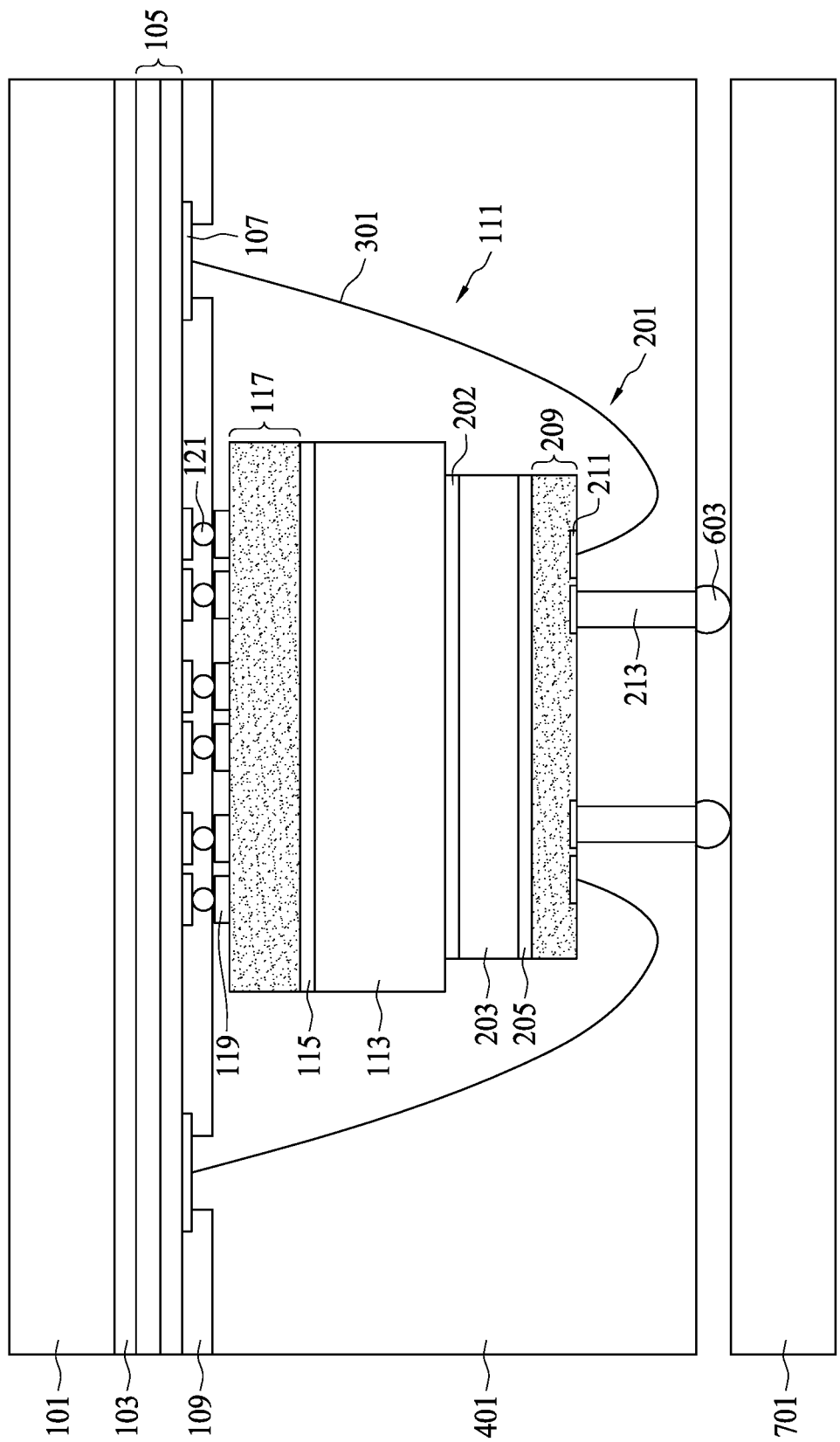

FIG. 11D illustrates the bonding of the fourth external connections 603 to the fourth substrate 701. In an embodiment the bonding may be performed as described above with respect to FIG. 7. For example, the fourth external connections 603 may be aligned with corresponding connections within the fourth substrate 701 and a reflow process may be performed. However, any suitable method of bonding may alternatively be utilized.

Figure 12A:
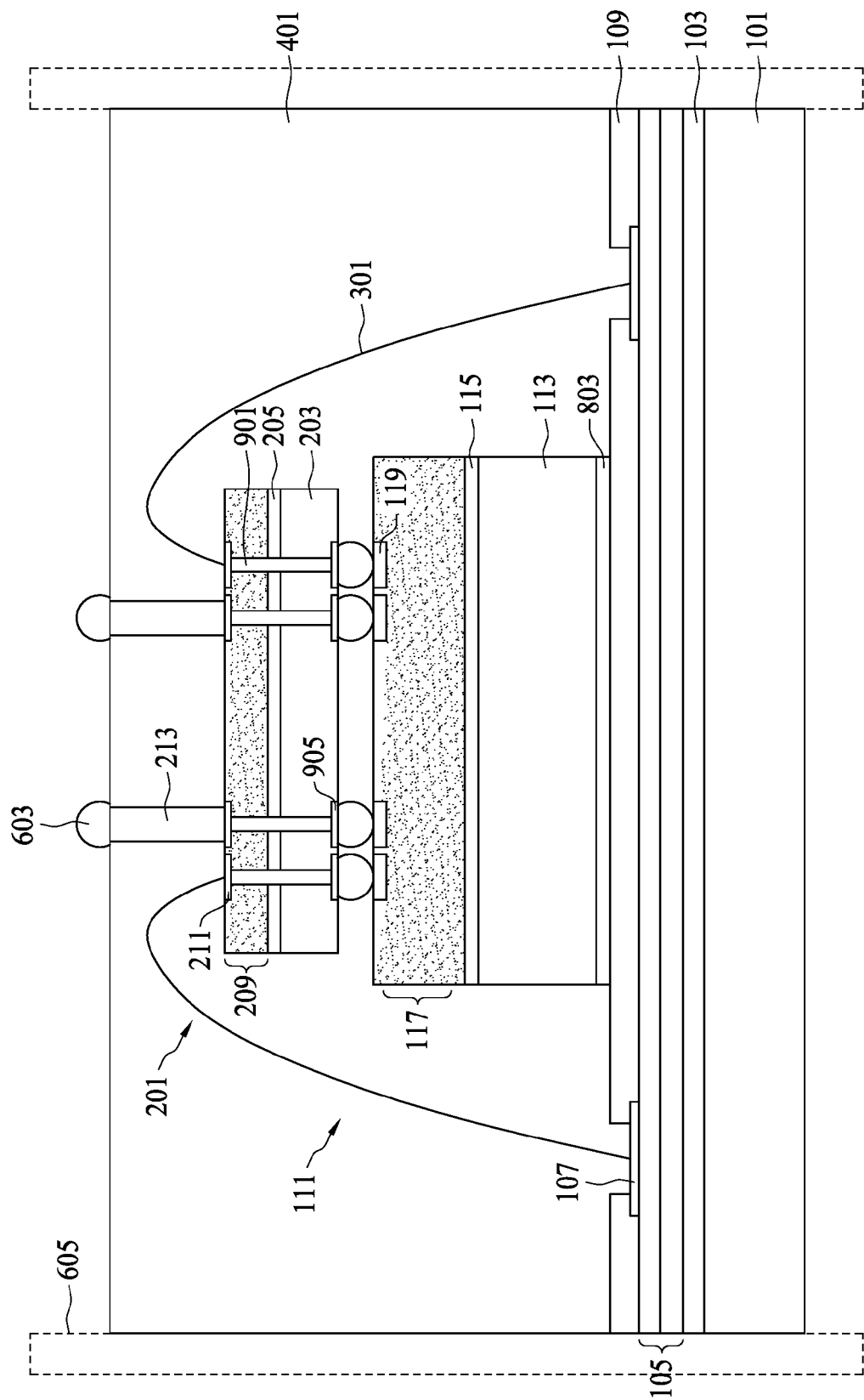
FIGS. 12A-12E illustrate further embodiments which utilize the conductive pillar, in accordance with some embodiments.

FIG. 12A illustrates another embodiment similar to the embodiment illustrated and described above with respect to FIG. 9, in which the first die 111 and the third die 607 are configured in a face-to-back configuration and in which the first die 111 and the second die 201 are configured in a face-to-back configuration with the first die 111 being electrically connected to the third die 607 through the TSVs 901 that extend through the second die 201. In this embodiment, however, the second external connections 213 are formed as the copper pillars and the grinding of the encapsulant 401 is performed as illustrated and described in FIGS. 11A-11B. Once formed, the fourth external connections 603 may be formed on the copper pillars of the second external connections 213, the third die 607 is singulated, and the fourth external connections 603 may be bonded to the fourth substrate 701 (not separately illustrated in FIG. 12A).

Figure 12B:
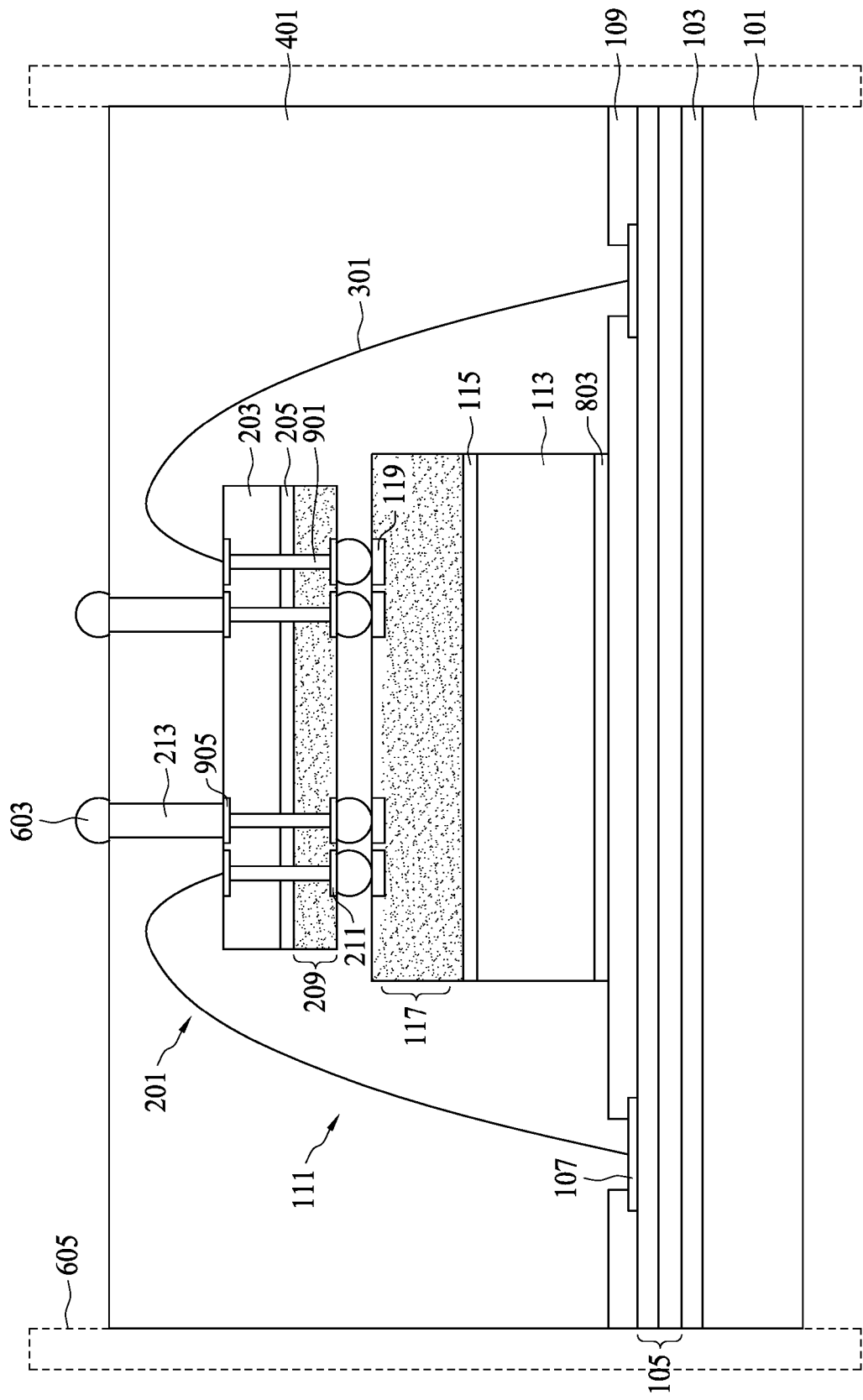

FIG. 12B illustrates another embodiment similar to the embodiment illustrated and described above with respect to FIG. 10, in which the first die 111 and the third die 607 are configured in a face-to-back configuration and in which the first die 111 and the second die 201 are configured in a face-to-face configuration with the first die 111 being electrically connected to the third die 607 through the TSVs 901 that extend through the second die 201. In this embodiment, however, the second external connections 213 are formed as the copper pillars and the grinding of the encapsulant 401 is performed as illustrated and described in FIGS. 11A-11B. Once formed, the fourth external connections 603 may be formed on the copper pillars of the second external connections 213, and the fourth external connections 603 may be bonded to the fourth substrate 701 (not separately illustrated in FIG. 12B).

Figure 12C:
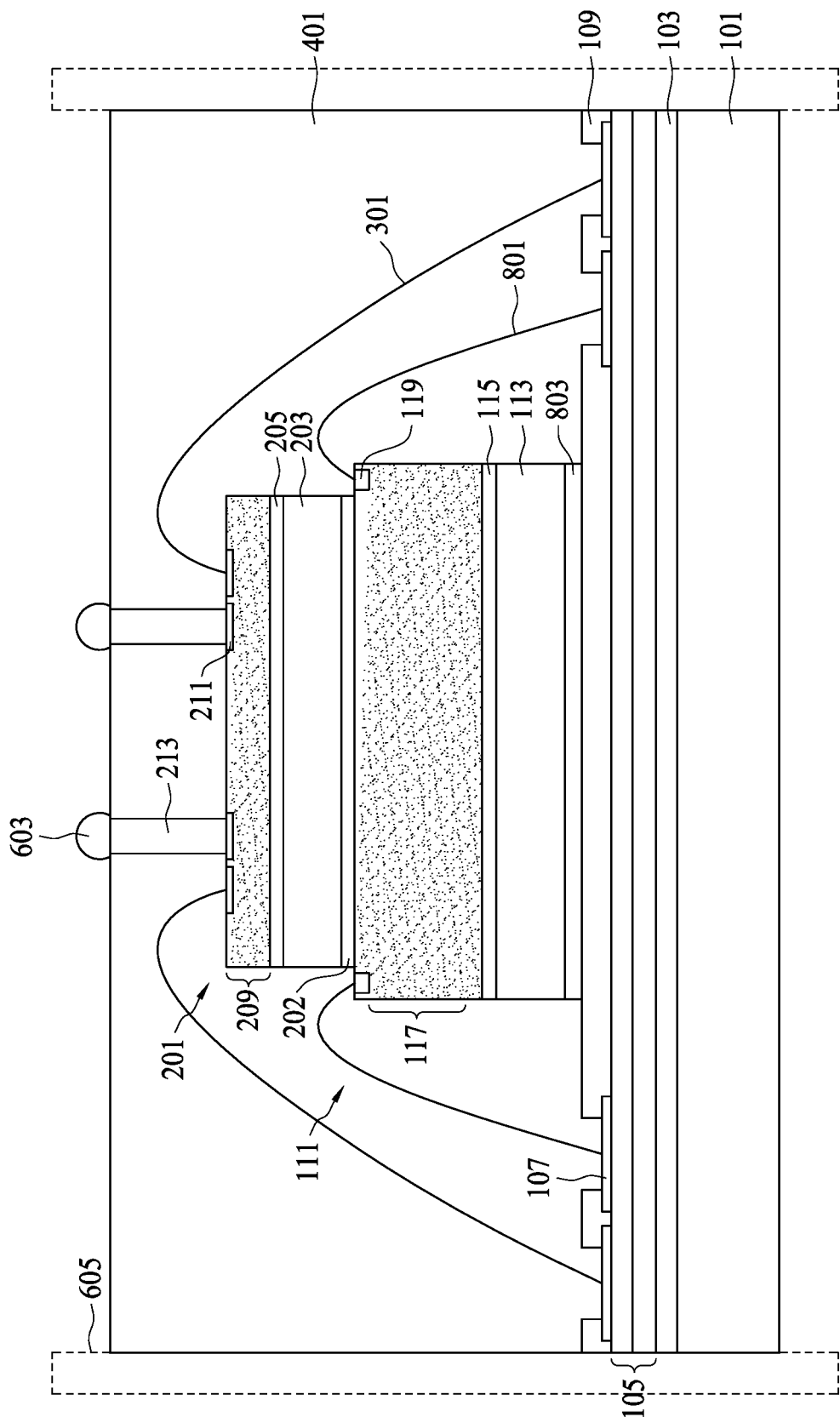

FIG. 12C illustrates another embodiment similar to the embodiment illustrated and described above with respect to FIG. 8, in which the first die 111 and the third die 607 are configured in a face-to-back configuration and in which the first die 111 and the second die 201 are configured in a face-to-back configuration, with the first die 111 being electrically connected to the third die 607 through the second wire bonds 801. In this embodiment, however, the second external connections 213 are formed as the copper pillars and the grinding of the encapsulant 401 is performed as illustrated and described in FIGS. 11A-11B. Once formed, the fourth external connections 603 may be formed on the copper pillars of the second external connections 213, and the fourth external connections 603 may be bonded to the fourth substrate 701 (not separately illustrated in FIG. 12C).

Figure 12D:
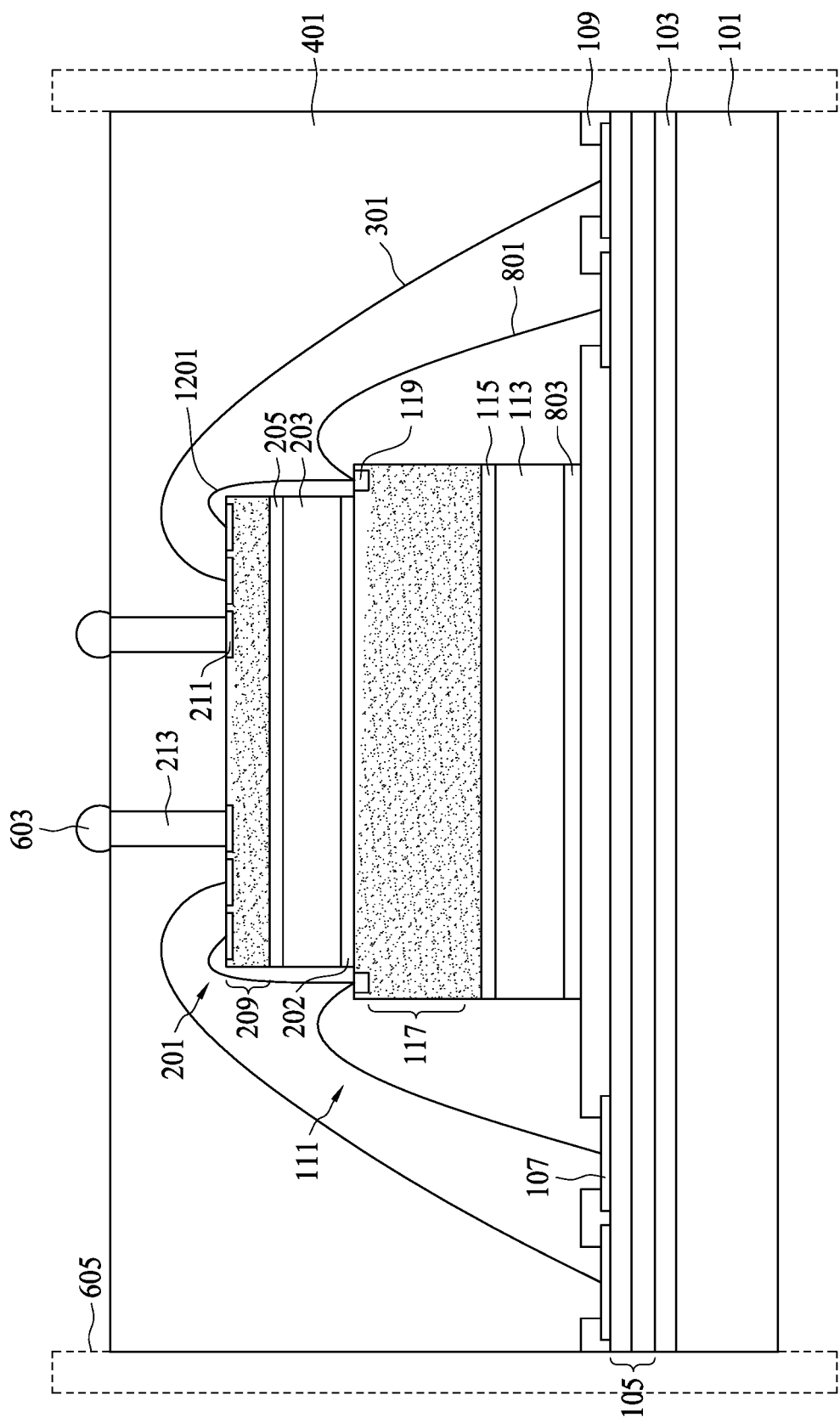

FIG. 12D illustrates another embodiment similar to the embodiment illustrated in FIG. 12C, in which the first die 111 and the third die 607 are configured in a face-to-back configuration and in which the first die 111 and the second die 201 are configured in a face-to-back configuration, with the first die 111 being electrically connected to the third die 607 through the second wire bonds 801. In this embodiment the first die 111 is additionally connected to the second die 201 using, e.g., third wire bonds 1201. In an embodiment the third wire bonds 1201 may be similar to the first wire bonds 301 and the second wire bonds 801 (described above with respect to FIG. 3 and FIG. 8, respectively), and are utilized to electrically connect the second contact pads 119 of the first die 111 to the third contact pads 211 of the second die 201. These connections may be made to either second contact pads 119 of the first die 111 that are also connected to the first contact pads 107 of the third die 607 (as illustrated in FIG. 12D), or else to otherwise unconnected ones of the second contact pads 119.

Figure 12E:
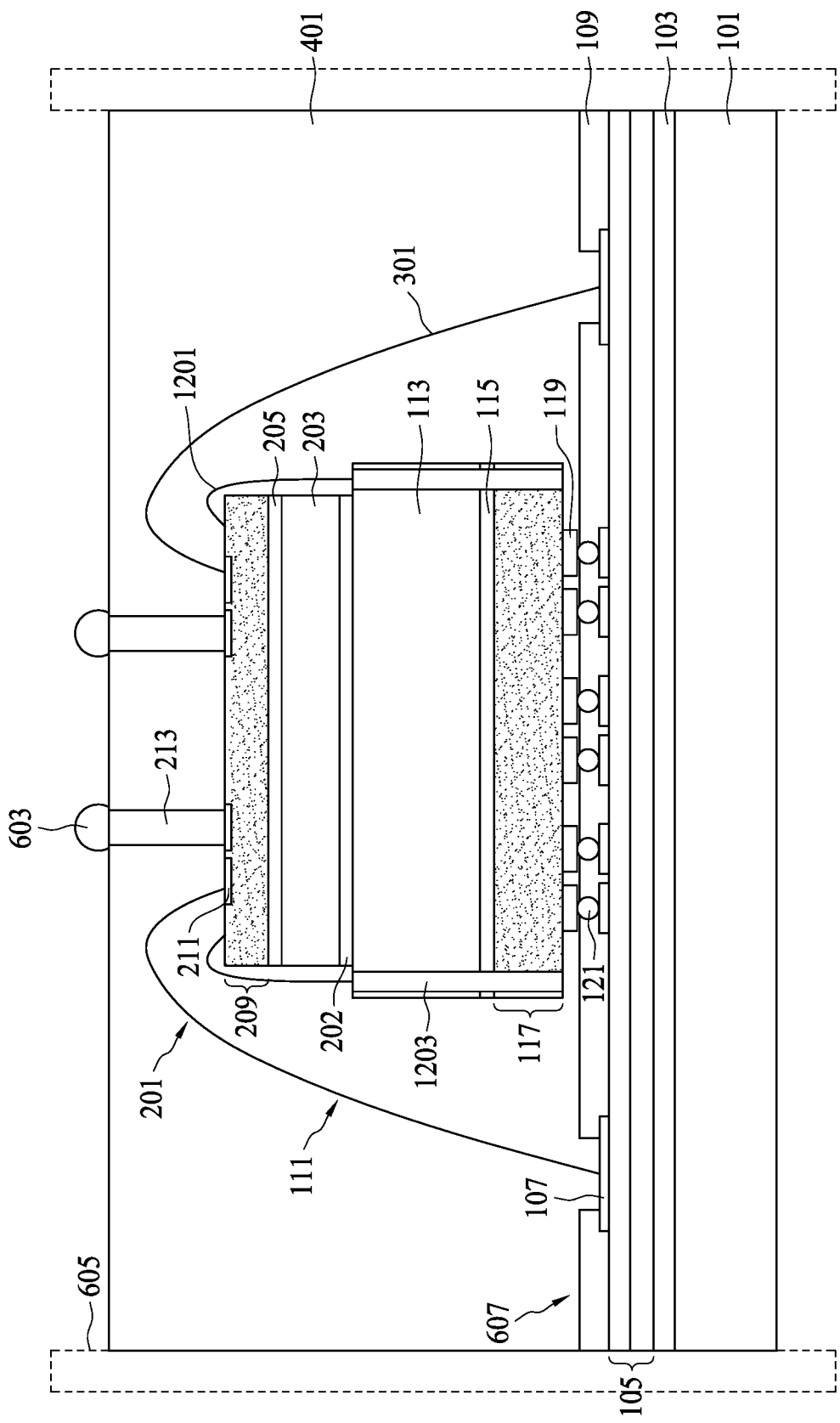

FIG. 12E illustrates another embodiment similar to the embodiment illustrates in FIG. 12D, in which the second die 201 is connected to the first die 111 using, e.g., the third wire bonds 1201. However, in this embodiment the first die 111 and the third die 607 are configured in a face-to-face configuration, and the first die 111 and the second die 201 are configured in a back-to-back configuration. As such, the second die 201 is connected to the first die 111 using third TSVs 1203. In an embodiment the third TSVs 1203 may be formed within the first die 111 using similar processes as the TSVs 901 formed in the second die 201 (described above with respect to FIG. 9).

Figure 13A:
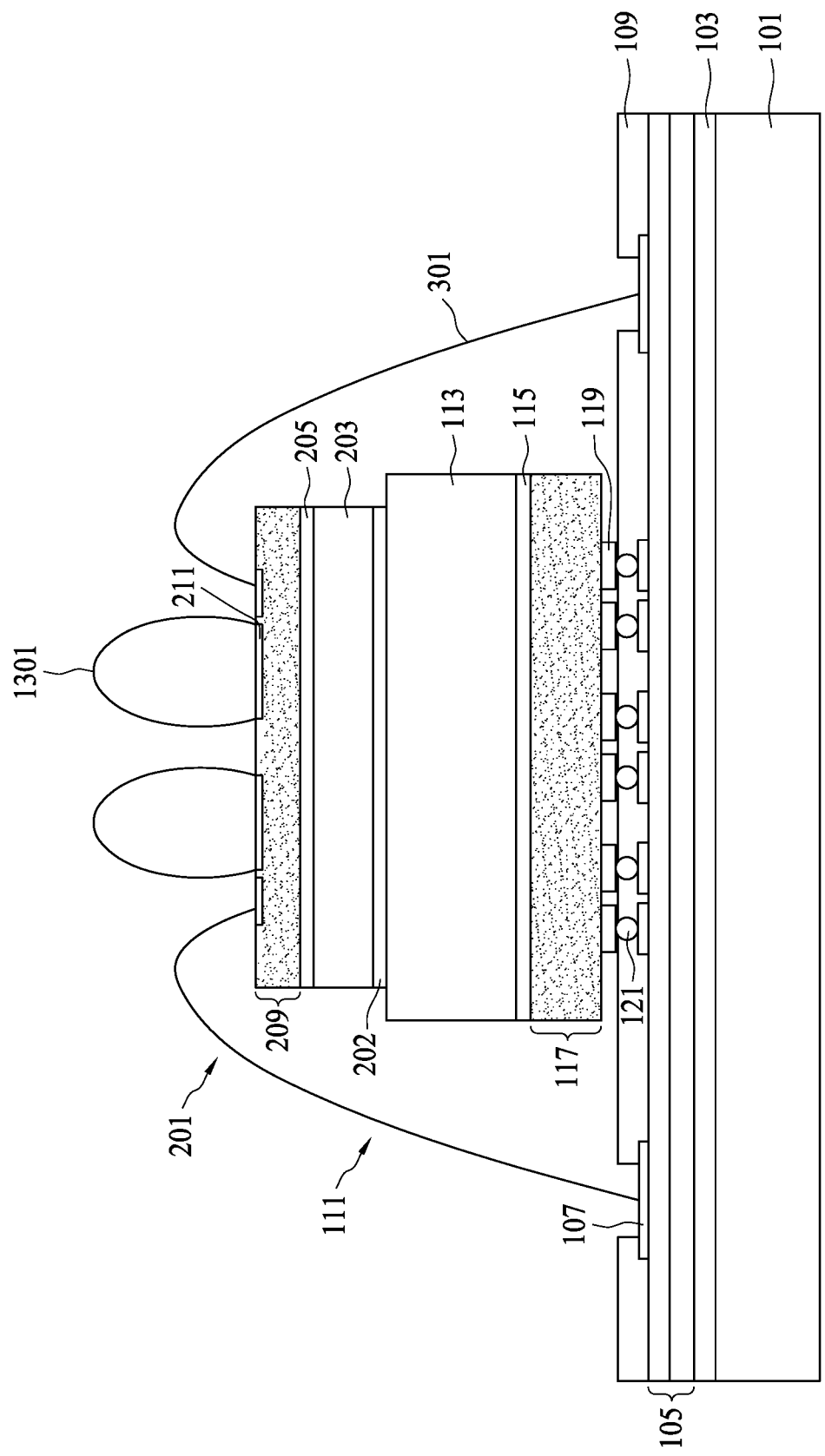
FIGS. 13A-13C illustrate an embodiment that utilizes an exposed ball molding process, in accordance with some embodiments.

FIG. 13A illustrates yet another embodiment that utilizes an exposed ball molding process. As a starting point, the embodiment is similar to the embodiment illustrated and discussed above with respect to FIG. 2, in which the first die 111 and the third die 607 are in a face-to-face configuration and the first die 111 and the second die 201 are in a back-to-back configuration. However, in this embodiment, the second external connections 213 and the conductive pads 215 are not formed on the third contact pads 211. Instead, third external connections 1301 are formed in electrical connection with the third contact pads 211.

In an embodiment the third external connections 1301 may be contact bumps such as solder balls in a ball grid array, microbumps, or controlled collapse chip connection (C4) bumps and may comprise a material such as tin, or other suitable materials, such as silver or copper. In an embodiment in which the third external connections 1301 are tin solder bumps, the third external connections 1301 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

After the third external connections 1301 have been formed, the first wire bonds 301 may be placed in order to connect the third contact pads 211 (not covered by the third external connections 1301) to the first contact pads 107. In an embodiment the first wire bonds 301 may be formed as described above with respect to FIG. 3. However, any other suitable type of connection may be used to connect the third contact pads 211 to the first contact pads 107.

Figure 13B:
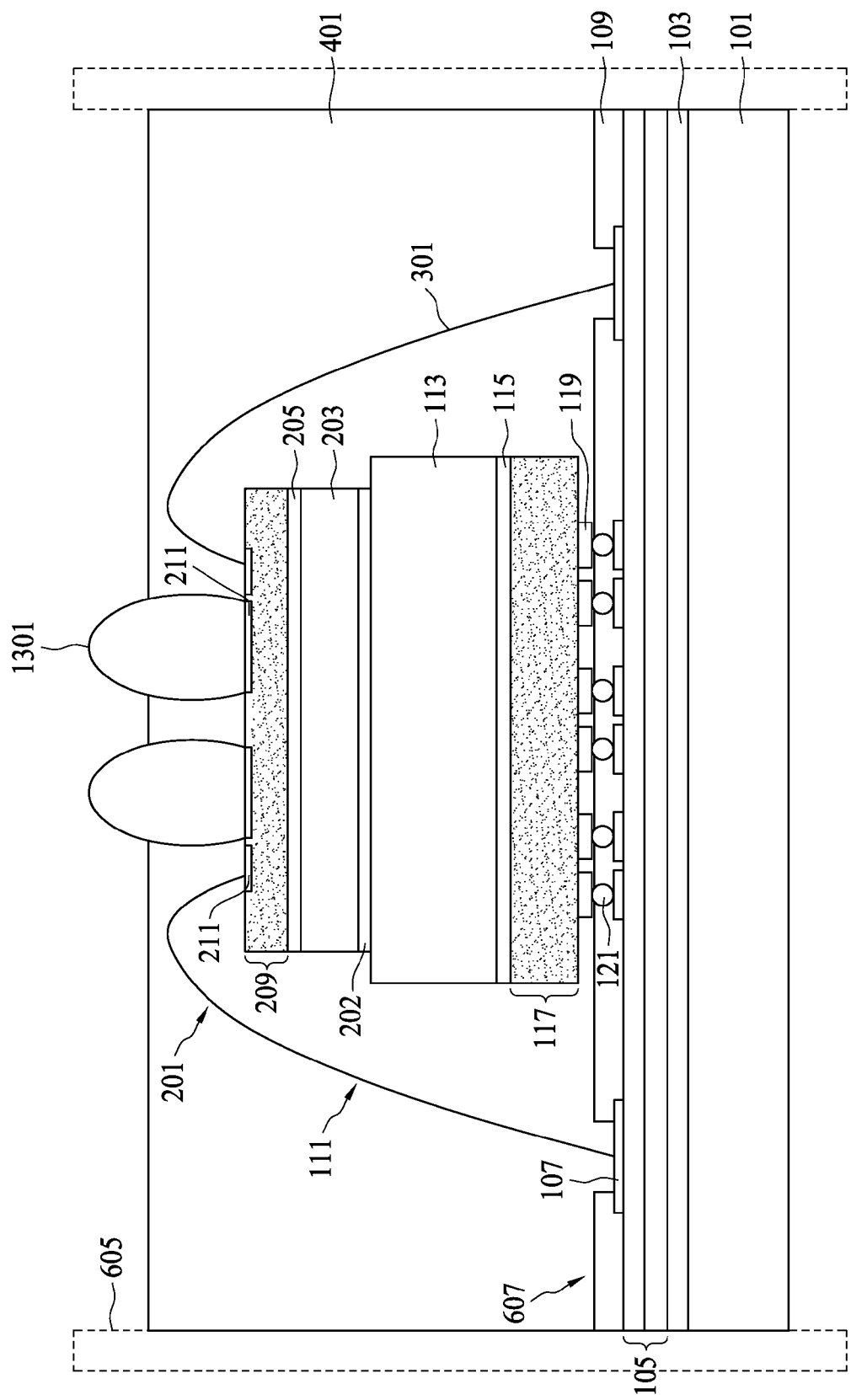

FIG. 13B illustrates a placement of the encapsulant 401 over the first die 111, the second die 201, and the first wafer 100 using, e.g., an exposed ball molding process. In an embodiment the molding chamber (not individually illustrated in FIG. 13B) is shaped such that the encapsulant 401, when placed within the molding chamber, will not fully cover the third external connections 1301. Alternatively, a stencil or other covering may be placed within the molding chamber in order to prevent the encapsulant from covering the upper portions of the third external connections 1301.

Once in place within the molding chamber, and with the upper portions of the third external connections 1301 protected, the encapsulant 401 is introduced into the chamber such that the encapsulant 401 does not cover the third external connections 1301. Once in place, the encapsulant 401 is cured to harden the encapsulant 401 (as described above with respect to FIG. 4). Once cured, the third die 607 may be singulated from the remainder of the first wafer 100, and the third external connections 1301 may be bonded to the fourth substrate 701 (not illustrated in FIG. 13B).

Figure 13C:
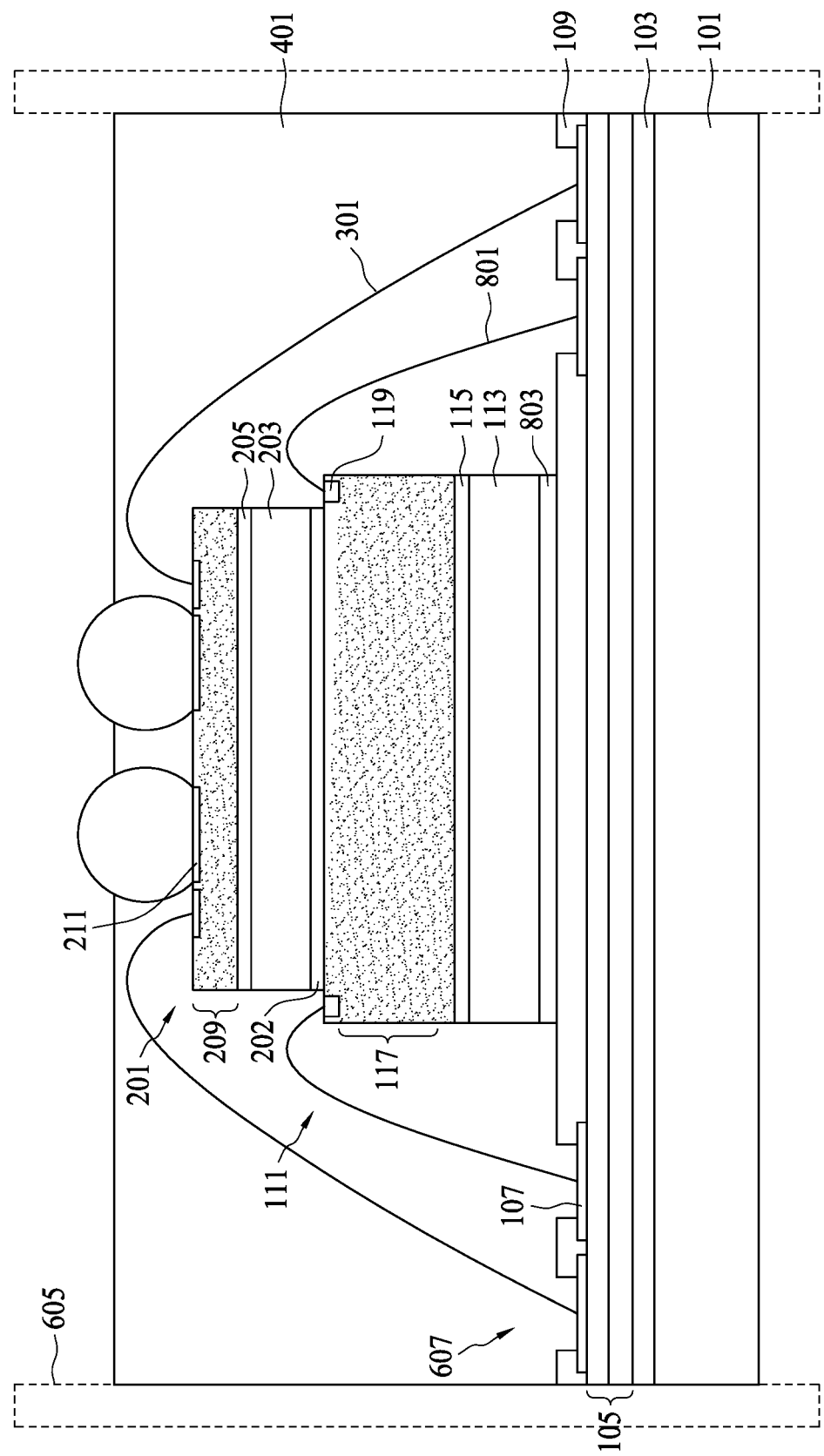

FIG. 13C illustrates another embodiment similar to the embodiment illustrated and discussed above with respect to FIG. 12C, in which the first die 111 and the third die 607 are configured in a face-to-back configuration and in which the first die 111 and the second die 201 are configured in a face-to-back configuration, with the first die 111 being electrically connected to the third die 607 through the second wire bonds 801. In this embodiment, however, the second external connections 213 and the fourth external connections 603 are not formed. Rather, the third external connections 1301 are formed prior to encapsulation and an exposed ball molding process is utilized as described above with respect to FIGS. 13A-13B. Once the third external connections 1301 have been placed, the first die 111, the second die 201, and the first wafer 100 are encapsulated with the encapsulant 401 without covering the third external connections 1301, the third die 607 is singulated from the first wafer 100, and the third external connections 1301 may be bonded to the fourth substrate 701 (not illustrated in FIG. 13C).

By utilizing an exposed ball molding process, a thinner and lower cost structure may be achieved. Additionally, by forming the process as described, there is no need for a packaging substrate, which may be between about 20% and 30% of the costs for the packaging process. Finally, by using the exposed ball molding process, the grinding and laser drilling that may be utilized when the contacts are overmolded may be avoided.

FIGS. 14A-14D illustrate another embodiment in which second TSVs 1401 are formed within the first wafer 100. In this embodiment the first substrate 101, the first active device layer 103, and the first metallization layers 105 may be formed as described above with respect to FIG. 1. Additionally, sixth contact pads 1411 are formed in electrical connection to the first metallization layers 105. In an embodiment the sixth contact pads 1411 may be similar to and formed in a similar process as the first contact pads 107 (described above with respect to FIG. 1).

Once the sixth contact pads 1411 have been formed, a third protective layer 1412 may be formed and patterned to protect the sixth contact pads 1411. In an embodiment the third protective layer 1412 may be similar to the first protective layer 109 (described above with respect to FIG. 1). Once formed, the third protective layer 1412 may be patterned to expose the sixth contact pads 1411 using, e.g., a photolithographic masking and etching process.

Once the sixth contact pads 1411 has been exposed, underbump metallizations (UBMs) 1413 may be formed in physical and electrical connection with the sixth contact pads 1411. In an embodiment the UBMs 1413 may comprise copper or nickel, although any suitable material or combination of materials may alternatively be utilized. For example, in an alternative embodiment the UBMs 1413 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 1413. Any suitable materials or layers of material that may be used for the UBMs 1413 are fully intended to be included within the scope of the current application.

The UBMs 1413 may be created by forming a layer of material over the sixth contact pads 1411. The forming of each layer may be performed using a plating process, such as electroless plating, although other processes of formation, such as sputtering, evaporation, or PECVD process, may alternatively be used depending upon the desired materials. In an embodiment the UBMs 1413 may have a height of between about 10 µm and about 100 µm, such as about 15 µm.

In an embodiment the second TSVs 1401 may be formed prior to the formation of the first metallization layer 105, the sixth contact pads 1411, the third protective layer 1412, and the UBMs 1413. The second TSVs 1401 may be formed through the first wafer 100, and the process for forming them may start by initially applying and developing a suitable fourth photoresist (which may be similar to the first photoresist discussed above), and then etching the first wafer 100 to generate second TSV openings. The openings for the second TSVs 1401 at this stage may be formed so as to extend through the first active device layer 103 and into the first substrate 101 to a depth at least greater than the eventual desired height of the finished third die 607. Accordingly, while the depth is dependent upon the overall design of the third die 607, the depth may be between about 1 µm and about 700 µm below the surface on the first substrate 101, such as a depth of about 50 µm. The openings for the second TSVs 1401 may be formed to have a diameter of between about 1 µm and about 100 µm, such as about 6 µm.

Once the openings for the second TSVs 1401 have been formed, the openings for the second TSVs 1401 may be filled with, e.g., a barrier layer (not separately illustrated) and a second conductive material 1402. The barrier layer may comprise a conductive material such as titanium nitride, although other materials, such as tantalum nitride, titanium, a dielectric, or the like may alternatively be utilized. The barrier layer may be formed using a CVD process, such as PECVD. However, other alternative processes, such as sputtering or metal organic chemical vapor deposition (MOCVD), may alternatively be used. The barrier layer may be formed so as to contour to the underlying shape of the opening for the second TSVs 1401.

The second conductive material 1402 may comprise copper, although other suitable materials such as aluminum, alloys, doped polysilicon, combinations thereof, and the like, may alternatively be utilized. The second conductive material 1402 may be formed by depositing a seed layer and then electroplating copper onto the seed layer, filling and overfilling the openings for the second TSVs 1401. Once the openings for the second TSVs 1401 have been filled, excess barrier layer and excess second conductive material 1402 outside of the openings for the second TSVs 1401 may be removed through a grinding process such as chemical mechanical polishing (CMP), although any suitable removal process may be used.

Figure 14A:
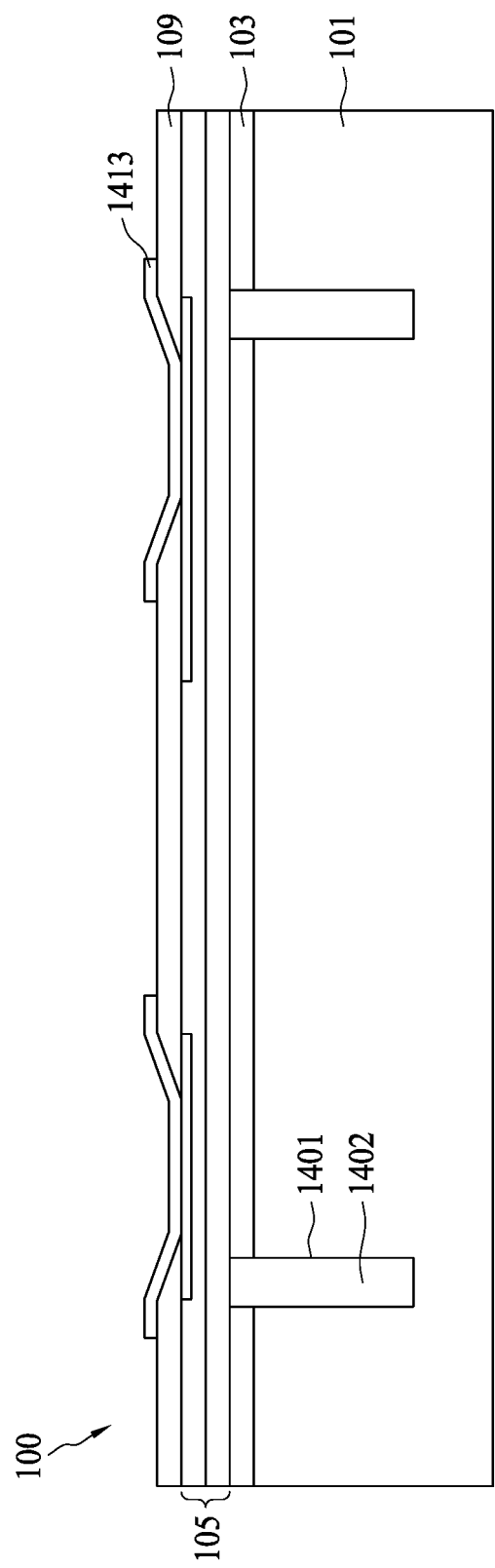
FIGS. 14A-14D illustrate embodiments which utilize through substrate vias that extend through the third die.
Figure 14B:
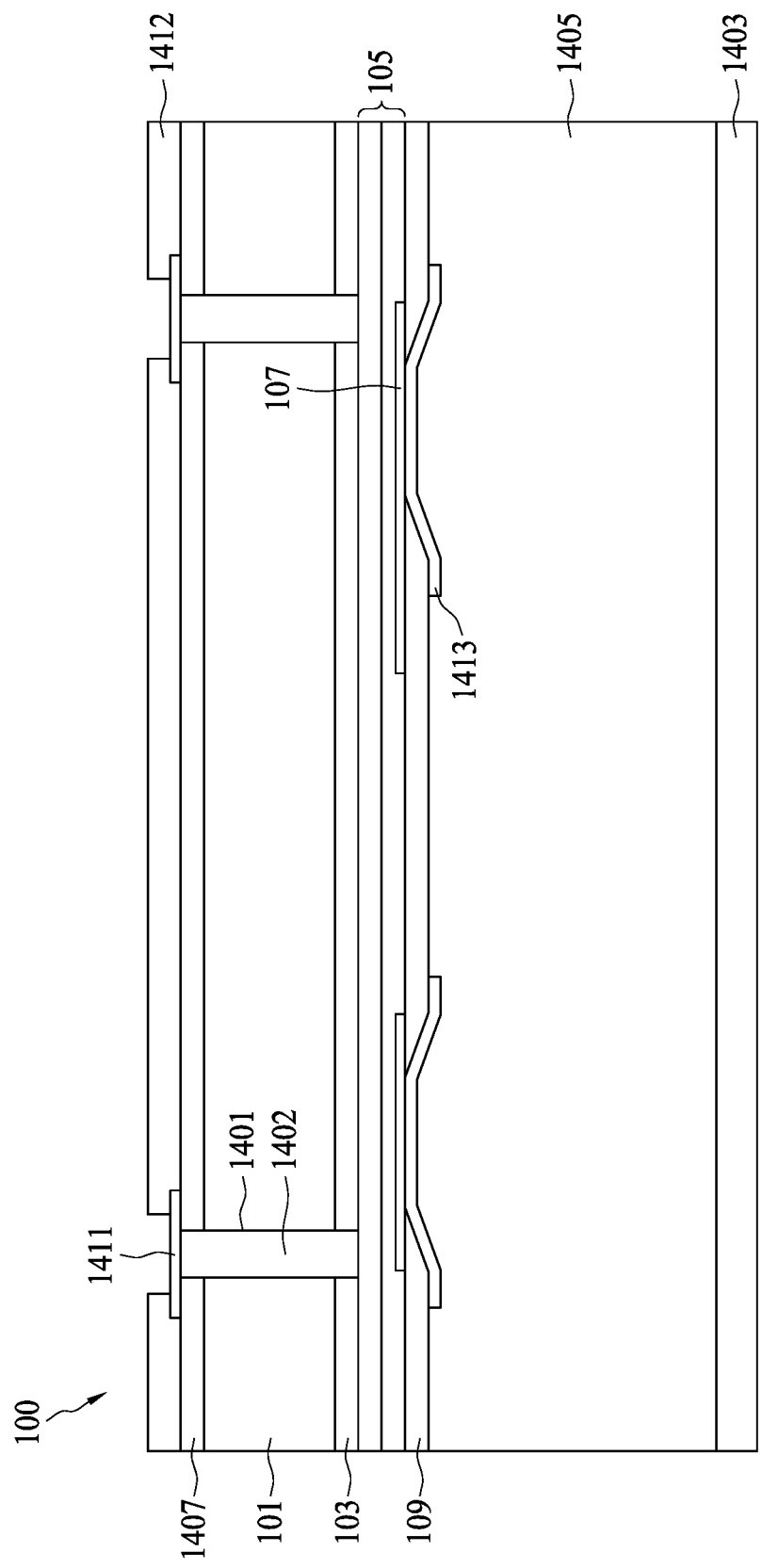

FIG. 14B illustrates a thinning of the first substrate 101 in order to expose the second conductive material 1402 and form the second TSVs 1401. In an embodiment the first substrate 101 may be thinned by initially attaching a carrier substrate 1403 over the first protective layer 109 with a third adhesive layer 1405. In an embodiment the carrier substrate 1403 comprises, for example, silicon based materials, such as glass or silicon oxide, or other materials, such as aluminum oxide, combinations of any of these materials, or the like.

The third adhesive layer 1405 is placed on the carrier substrate 1403 in order to provide support to the first substrate 101 during subsequent processing. In an embodiment the third adhesive layer 1405 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The third adhesive layer 1405 may be placed onto the carrier substrate 1403 in a semi-liquid or gel form, which is readily deformable under pressure, and then placed in contact with the first substrate 101.

Once the carrier substrate 1403 has been attached, a thinning of the second side of the first substrate 101 may be performed in order to expose the openings for the second TSVs 1401 and form the second TSVs 1401 from the second conductive material 1402 that extends through the first substrate 101. In an embodiment, the thinning of the second side of the first substrate 101 may leave the second TSVs 1401. The thinning of the first substrate 101 may be performed by a planarization process such as CMP whereby chemical etchants and abrasives are utilized to react and grind away the first substrate 101.

However, as one of ordinary skill in the art will recognize, the above described process for forming the second TSVs 1401 is merely one method of forming the second TSVs 1401, and other methods are also fully intended to be included within the scope of the embodiments. For example, forming the openings for the second TSVs 1401, filling the openings for the second TSVs 1401 with a dielectric material, thinning the first substrate 101 to expose the dielectric material, removing the dielectric material, and filling the openings for the second TSVs 1401 with a conductor may also be used. This and all other suitable methods for forming the second TSVs 1401 into the first substrate 101 are fully intended to be included within the scope of the embodiments.

Optionally, once the second TSVs 1401 have been exposed, the first wafer 100 may be recessed such that the second TSVs 1401 extend from the first substrate 101. In an embodiment the first wafer 100 may be recessed by etching the first wafer 100 without substantially removing the conductive material of the second TSVs 1401.

Once the second TSVs 1401 have been exposed and, optionally, recessed, a redistribution layer (RDL) 1407 may be formed in physical and electrical connection with the second TSVs 1401. In an embodiment the RDL 1407 may be utilized to allow the first contact pads 107 that are electrically connected to the second TSVs 1401 to be placed in any desired location on the third die 607, instead of limiting the location of the first contact pads 107 to the region directly over the second TSVs 1401. In an embodiment the RDL 1407 may be formed by initially forming a seed layer (not shown) of a titanium copper alloy through a suitable formation process such as CVD or sputtering. A fifth photoresist (not shown) may then be formed to cover the seed layer, and the fifth photoresist may then be patterned to expose those portions of the seed layer that are located where the RDL 1407 is desired to be located.

Once the fifth photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may alternatively be used to form the RDL 1407.

Once the conductive material has been formed, the fifth photoresist may be removed through a suitable removal process such as ashing. Additionally, after the removal of the fifth photoresist, those portions of the seed layer that were covered by the fifth photoresist may be removed through, for example, a suitable etch process using the conductive material as a mask.

Once the RDL 1407 has been formed, the first contact pads 107 may be formed in electrical connection with the RDL 1407 and the second TSVs 1401. Additionally, the first protective layer 109 may also be formed and patterned over the first contact pads 107. In an embodiment the first contact pads 107 and the first protective layer 109 are formed as described above with respect to FIG. 1.

Figure 14C:
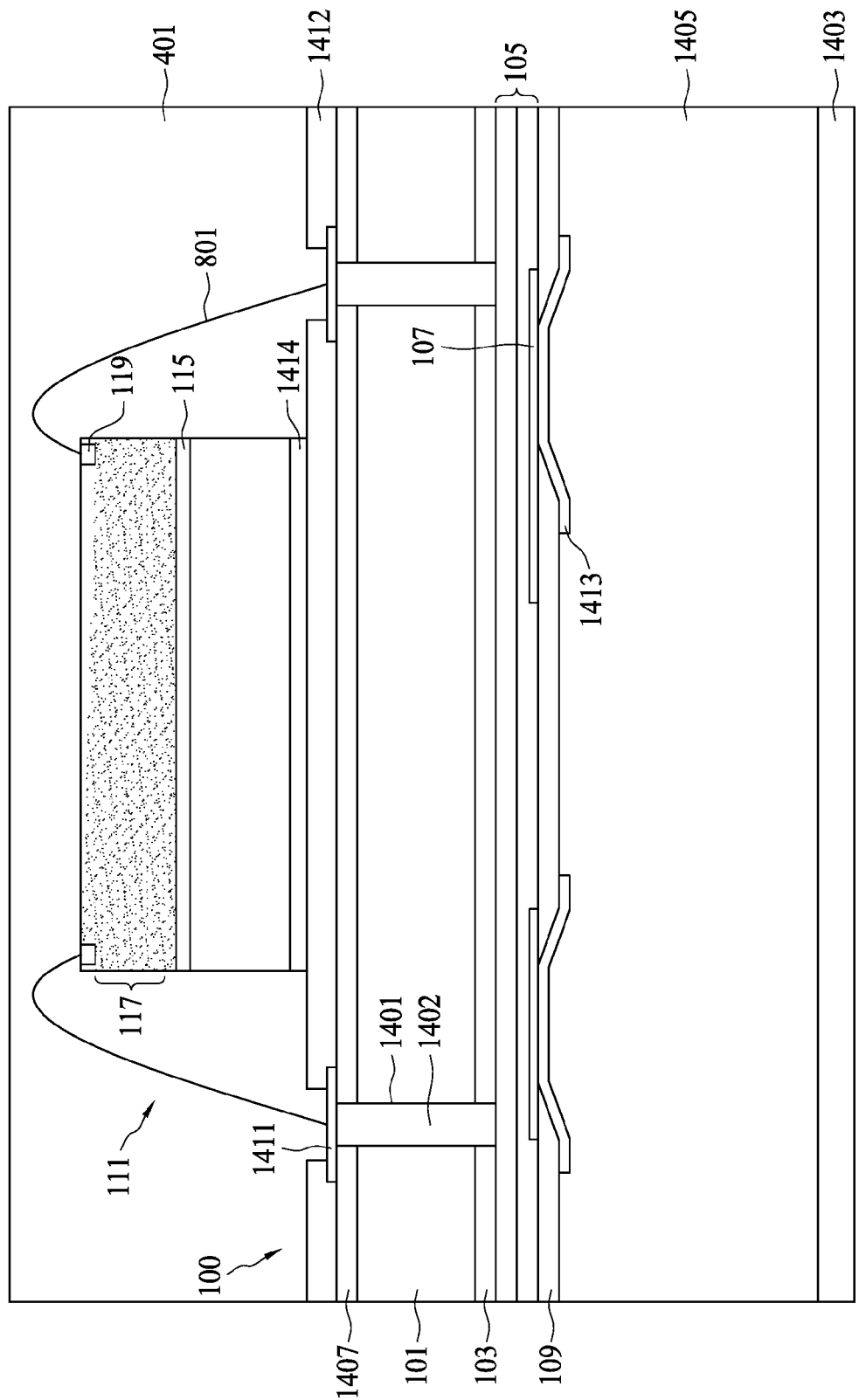

FIG. 14C illustrates a placement of the first die 111 onto the first wafer 100 and a connecting of the first die 111 to the first wafer 100 with, e.g., the second wire bond 801. In an embodiment the first die 111 may be attached to the first wafer 100 with, e.g., a fourth adhesive layer 1414. In an embodiment the fourth adhesive layer 1414 may be similar to the first adhesive layer 202 (described above with respect to FIG. 2). For example, the fourth adhesive layer 1414 may be an ultra-violet glue. However, the fourth adhesive layer 1414 may alternatively be different than the first adhesive layer 202.

Once the first die 111 has been attached with the fourth adhesive layer 1414, the first die 111 may be electrically connected to the first wafer 100 using, e.g., the second wire bond 801. For example, the second wire bond 801 may be placed in order to electrically connect the second contact pads 119 on the first die 111 to the first contact pads 107 and the second TSVs 1401 on the first wafer 100. However, any suitable connection may alternatively be utilized.

Once the first die 111 has been physically and electrically connected to the first wafer 100, the first die 111 and the first wafer 100 may be encapsulated with the encapsulant 401. In an embodiment the first die 111 and the first wafer 100 may be placed within the molding chamber (not illustrated in FIG. 14C). Once placed, the encapsulant 401 is placed within the molding chamber and then cured in order to protect the first die 111 and the first wafer 100.

Figure 14D:
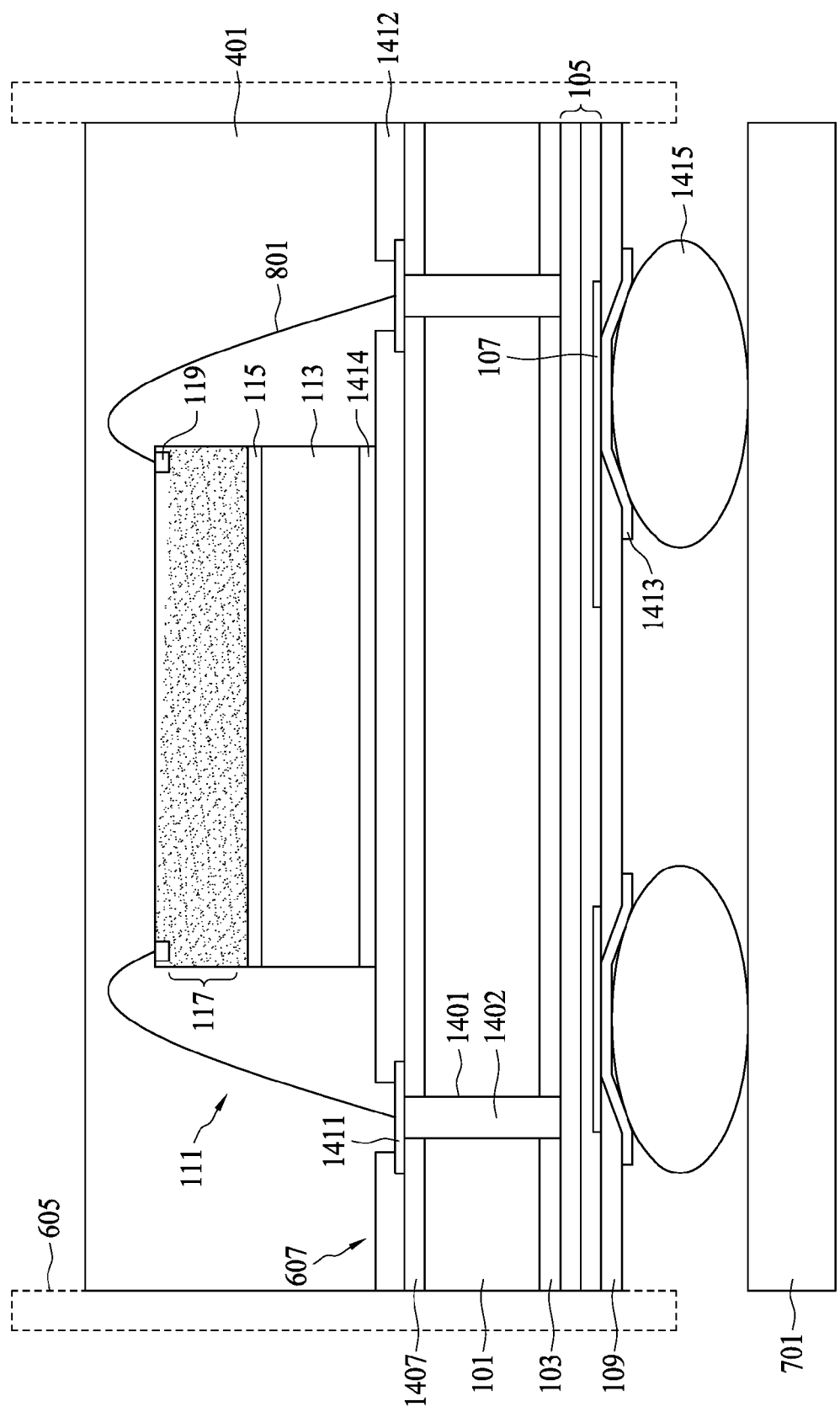

FIG. 14D illustrates a removal of the carrier substrate 1403. In an embodiment the carrier substrate 1403 and the third adhesive layer 1405 are debonded from the remainder of the structure using, e.g., a thermal process to alter the adhesive properties of the third adhesive layer 1405. In a particular embodiment an energy source such as an ultra-violet (UV) laser, a carbon dioxide ($CO_2$) laser, or an infrared (IR) laser, is utilized to irradiate and heat the third adhesive layer 1405 until the third adhesive layer 1405 loses at least some of its adhesive properties. Once performed, the carrier substrate 1403 and the third adhesive layer 1405 may be physically separated and removed from the structure.

FIG. 14D additionally illustrates a placement of sixth external connections 1415 onto the UBMs 1413. In an embodiment the sixth external connections 1415 may be contact bumps such as solder balls, microbumps, or controlled collapse chip connection (C4) bumps and may comprise a material such as tin, or other suitable materials, such as silver or copper. In an embodiment in which the sixth external connections 1415 are tin solder bumps, the sixth external connections 1415 may be formed by initially forming a layer of tin through any suitable method such as ball placement, evaporation, electroplating, printing, solder transfer, etc, to a thickness of, e.g., about 100 µm. Once a layer of tin has been formed on the structure, a reflow is performed in order to shape the material into the desired bump shape.

FIG. 14D also illustrates a singulation of the third die 607 from the first wafer 100. In an embodiment a laser may be used to form grooves within the encapsulant 401 and the first wafer 100. Once the grooves have been formed, the singulation may be performed by using a saw blade (represented in FIG. 14D by the dashed boxes labeled 605) to slice the first wafer 100, thereby separating the first wafer 100 into separate components.

FIG. 14D also illustrates a bonding of the sixth external connections 1415 to the fourth substrate 701. For example, in an embodiment the sixth external connections 1415 of the singulated component may be aligned and placed into physical contact with corresponding electrical connections (not separately illustrated in FIG. 14D) of the fourth substrate 701. Once in place and aligned, the sixth external connections 1415 may be reflowed in order to physically and electrically bond the sixth external connections 1415 (and, as such, the singulated component) to the fourth substrate 701.

By utilizing the process as described above with respect to FIGS. 14A-14D, a substrate-less package structure that combines through substrate vias and wire-bonding processes provide a better form factor and wafer level package and also implement a high I/O routing. Additionally, as no microbumps are utilized between the first die 111 and the third die 607, there is no need for the microbumps process, and the usual problems that surround the microbumps joints can be avoided.

In accordance with an embodiment, a semiconductor device comprising a first die and a second die attached to the first die is provided. A third die is attached to the second die and located on an opposite side of the second die than the first die. Wire bonds electrically connect the third die to the first die. An encapsulant encapsulates the second die and the third die and in physical contact with a first surface of the first die. First external connections extend into the encapsulant and in electrical connection with the third die.

In accordance with another embodiment, a semiconductor device comprising a first die over a second die, the first die being electrically connected to the second die, is provided. A third die is over the first die, the third die electrically connected to the second die. First external connections are connected to the third die. An encapsulant protects the first die and the third die, wherein the first external connections extend away from the encapsulant. A wire bond is embedded within the encapsulant, wherein the wire bond electrically connects the third die to the second die.

In accordance with yet another embodiment, a semiconductor device comprising a first die is provided. The first die further comprises a semiconductor substrate and through substrate vias extending through the semiconductor substrate. A second die is attached to the first die, wherein the second die has a smaller width than the first die. Wire bonds electrically connect the first die and the second die, wherein the wire bonds are electrically connected to the through substrate vias. An encapsulant encapsulates the first die and in physical contact with a first side of the first die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a first die;
   a second die attached to the first die;
   a third die attached to the second die and located on an opposite side of the second die than the first die;
   wire bonds electrically connecting the third die to the first die;
   an encapsulant encapsulating the second die and the third die and in physical contact with a first surface of the first die; and
   first external connections extending into the encapsulant and in electrical connection with the third die, wherein the first external connections comprise solder extending into the encapsulant.

2. The semiconductor device of claim 1, wherein the first external connections further comprise:
   a copper pillar; and
   a conductive cap on the copper pillar, wherein the solder is on the conductive cap.

3. The semiconductor device of claim 1, wherein the second die is electrically connected to the wire bonds with through substrate vias that extend through the third die.

4. The semiconductor device of claim 1, wherein the second die is electrically connected to the first die with second wire bonds.

5. The semiconductor device of claim 1, wherein the first external connections further comprise a conductive bump, the conductive bump extending into the encapsulant and in physical connection with the third die.

6. The semiconductor device of claim 1, wherein the first die and the second die are in a face-to-face configuration.

7. The semiconductor device of claim 1, wherein the first die and the second die are in a face-to-back configuration.

8. The semiconductor device of claim 1, wherein the first die and the third die are in a face-to-face configuration.

9. The semiconductor device of claim 1, wherein the first die and the third die are in a face-to-back configuration.

10. A semiconductor device comprising:
    a first die;
    a second die attached to the first die;
    a third die attached to the second die and located on an opposite side of the second die than the first die;
    wire bonds electrically connecting the third die to the first die;
    an encapsulant encapsulating the second die and the third die and in physical contact with a first surface of the first die; and
    first external connections extending into the encapsulant and in electrical connection with the third die, wherein the first external connections comprise:
    a copper pillar;
    a conductive cap on the copper pillar; and
    a conductive material on the conductive cap.

11. The semiconductor device of claim 10, wherein the second die is electrically connected to the wire bonds with through substrate vias that extend through the third die.

12. The semiconductor device of claim 10, wherein the second die is electrically connected to the first die with second wire bonds.

13. The semiconductor device of claim 10, wherein the first external connections further comprise a conductive bump, the conductive bump extending into the encapsulant and in physical connection with the third die.

14. A semiconductor device comprising:
    a first die;
    a second die attached to the first die;
    a third die attached to the second die and located on an opposite side of the second die than the first die;
    wire bonds electrically connecting the third die to the first die, wherein the second die is electrically connected to the wire bonds with through substrate vias that extend through the third die;
    an encapsulant encapsulating the second die and the third die and in physical contact with a first surface of the first die; and
    first external connections extending into the encapsulant and in electrical connection with the third die.

15. The semiconductor device of claim 14, wherein the first external connections comprise solder extending into the encapsulant.

16. The semiconductor device of claim 14, wherein the first external connections further comprise:
    a copper pillar;
    a conductive cap on the copper pillar; and
    a conductive material on the conductive cap.

17. The semiconductor device of claim 14, wherein the first external connections further comprise:
    a conductive pillar that is planar with an outer surface of the encapsulant; and
    a conductive bump in physical connection with the conductive pillar.

18. The semiconductor device of claim 14, wherein the second die is electrically connected to the first die with second wire bonds.

19. The semiconductor device of claim 14, wherein the first external connections further comprise a conductive bump, the conductive bump extending into the encapsulant and in physical connection with the third die.

20. The semiconductor device of claim 14, wherein the encapsulant has a first sidewall, the first die has a second sidewall, and the first sidewall is planar with the second sidewall.

* * * * *